United States Patent [19]
Noble et al.

[11] Patent Number: 5,973,356
[45] Date of Patent: Oct. 26, 1999

[54] ULTRA HIGH DENSITY FLASH MEMORY

[75] Inventors: Wendell P. Noble, Milton, Vt.;
Leonard Forbes, Corvallis, Oreg.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/889,554

[22] Filed: Jul. 8, 1997

[51] Int. Cl.$^6$ .................................................. H01L 29/76
[52] U.S. Cl. ..................... 257/319; 257/314; 257/315; 257/316; 365/185.01; 365/185.26
[58] Field of Search ................................ 257/314, 315, 257/316, 318, 319, 321; 365/185.01, 185.05, 185.06

[56] References Cited

U.S. PATENT DOCUMENTS

| | | | |
|---|---|---|---|
| 4,051,354 | 9/1977 | Choate | 235/312 |
| 4,604,162 | 8/1986 | Sobczak | 156/657 |
| 4,663,831 | 5/1987 | Birrittella et al. | 29/576 E |
| 4,673,962 | 6/1987 | Chatterjee et al. | 357/23.6 |
| 4,761,768 | 8/1988 | Turner et al. | 365/201 |
| 4,766,569 | 8/1988 | Turner et al. | 365/185 |
| 4,920,065 | 4/1990 | Chin et al. | 437/52 |
| 4,958,318 | 9/1990 | Harari | 365/149 |
| 4,987,089 | 1/1991 | Roberts | 437/34 |
| 5,001,526 | 3/1991 | Gotou | 357/23.6 |
| 5,006,909 | 4/1991 | Kosa | 357/23.6 |
| 5,017,504 | 5/1991 | Nishimuro et al. | 437/40 |
| 5,021,355 | 6/1991 | Dhong et al. | 437/35 |
| 5,028,977 | 7/1991 | Kenneth et al. | 357/43 |
| 5,057,896 | 10/1991 | Gotou | 257/296 |
| 5,072,269 | 12/1991 | Hieda | 257/302 |
| 5,102,817 | 4/1992 | Chatterjee et al. | 437/47 |

(List continued on next page.)

FOREIGN PATENT DOCUMENTS 363066963A 3/1988 Japan ....................................... 257/305

OTHER PUBLICATIONS

Adler, E., et al., "The Evolution of IBM CMOS DRAM Technology", *IBM Journal of Research and Development,* 39, 167–188, (Jan./Mar. 1995).

Asai, S., et al., "Technology Challenges for Integration Near and Below 0.1 μm", *Proceedings of the IEEE,* 85, Special Issue on Nanometer–Scale Science & Technology, 505–520, (Apr. 1997).

Banerjee, S.K., et al., "Characterization of Trench Transistors for 3–D Memories", *1986 Symposium on VLSI Technology, Digest of Technical Papers,* San Diego, CA, 79–80, (May 28–30, 1986).

(List continued on next page.)

*Primary Examiner*—Olik Chaudhuri
*Assistant Examiner*—Douglas A. Wille
*Attorney, Agent, or Firm*—Schwegman, Lundberg, Woessner & Kluth P.A.

[57] ABSTRACT

An ultra high density flash EEPROM provides increased nonvolatile storage capacity. A memory cell array includes densely packed memory cells, each cell having a semiconductor pillar providing shared source/drain regions for four vertical floating gate transistors that have individual floating and control gates distributed on the four sides of the pillar. Mutually orthogonal first gate lines and second gate lines provide addressing of the control gates. First source/drain terminals are row addressable by interconnection lines disposed substantially parallel to the first gate lines. Second source/drain terminals are column addressable by data lines disposed substantially parallel to the second gate lines. Both bulk semiconductor and silicon-on-insulator embodiments are provided. If a floating gate transistor is used to store a single bit of data, an area of only $F^2$ is needed per bit of data, where F is the minimum lithographic feature size. If multiple charge states (more than two) are used, an area of less than $F^2$ is needed per bit of data.

24 Claims, 21 Drawing Sheets

U.S. PATENT DOCUMENTS

| | | | |
|---|---|---|---|
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,222,081 | 6/1993 | Doan | 156/628 |
| 5,266,514 | 11/1993 | Tuan et al. | 437/52 |
| 5,316,962 | 5/1994 | Matsuo et al. | 437/52 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,422,499 | 6/1995 | Manning | 257/67 |
| 5,427,972 | 6/1995 | Shimizu et al. | 437/52 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki | 257/302 |
| 5,528,062 | 6/1996 | Hsieh et al. | 257/298 |
| 5,563,083 | 10/1996 | Pein | 437/43 |
| 5,574,299 | 11/1996 | Kim | 257/296 |
| 5,593,912 | 1/1997 | Rajeevakumar | 437/52 |
| 5,616,934 | 4/1997 | Dennison et al. | 257/67 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,691,230 | 11/1997 | Forbes | 437/62 |
| 5,705,415 | 1/1998 | Orlowski et al. | 437/43 |

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits,* 27, 618–625, (Apr. 1992).

Bomchil, G., et al., "Porous Silicon: The Material and its Applications in Silicon–On–Insulator Technologies", *Applied Surface Science,* 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers,* Honolulu, HI, 15–16, (Jun. 4–7, 1994).

Burnett, D., et al., "Statistical Threshold–Voltage Variation and its Impact on Supply–Voltage Scaling", *SPIE,* 2636, 83–90, (1995).

Chen, M.–J., et al., "Back–Gate Forward Bias Method for Low–Voltage CMOS Digital Circuits", *IEEE Transactions on Electron Devices,* 43, 904–909, (Jun. 1986).

Chen, M.–J., et al., "Optimizing the Match in Weakly Inverted MOSFET's by Gated Lateral Bipolar Action", *IEEE Transactions on Electron Devices,* 43, 766–773, (May 1996).

Chung, I.–V., et al., "A New SOI Inverter for Low Power Applications", Proceedings of the 1996 IEEE International SOI Conference, Sanibel Island, FL, 20–21, (Sep. 30—Oct. 3, 1996).

De, V.K., et al., "Random MOSFET Parameter Fluctuation Limits to Gigascale Integration (GSI)", *1996 Symposium on VLSI Technology, Digest of Technical Papers,* Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters,* 17, 509–511, (Nov. 1996).

Fong, Y., et al., "Oxides Grown on Textured Single–Crystal Silicon—Dependence on Process and Application in EEPROMs", *IEEE Transactions on Electron Devices,* 37, 583–590, (Mar. 1990).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers,* 286–287, (1997).

Gong, S., et al., "Techniques for Reducing Switching Noise in High Speed Digital Systems", *Proceedings of the 8th Annual IEEE International ASIC Conference and Exhibit,* 21–24, (1995).

Hao, M.–Y., et al., "Electrical Characteristics of Oxynitrides Grown on Textured Single–Crystal Silicon", *Appl. Phys. Lett.,* 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers,* Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", 1991 IEEE International Electron Devices Meeting, Technical Digest, Washington, D.C., 959–961, (Dec. 8–11, 1991).

Hodges, D.A., et al., "MOS Decoders", In: *Analysis and Design of Digital Integrated Circuits,* 2nd Edition, Mc–Graw–Hill Book Co., New York, 354–357, (1988).

Holman, W.T., et al., "A Compact Low Noise Operational Amplifier for a 1.2 μm Digital CMOS Technology", *IEEE Journal of Solid–State Circuits,* 30, 710–714, (Jun. 1995).

Huang, W.L., et al., "TFSOI Complementary BiCMOS Technology for Low Power Applications", *IEEE Transactions on Electron Devices,* 42, 506–512, (Mar. 1995).

Jun, Y.K., et al., "The Fabrication and Electrical Properties of Modulated Stacked Capacitor for Advanced DRAM Applications", *IEEE Electron Device Letters,* 13, 430–432, (Aug. 1992).

Kang, H.K., et al., "Highly Manufacturable Process Technology for Reliable 256 Mbit and 1Gbit DRAMs", IEEE International Electron Devices Meeting, Technical Digest, San Francisco, CA, 635–638, (Dec. 11–14, 1994).

Kim, Y.–S., et al., "A Study on Pyrolysis DMEAA for Selective Deposition of Aluminum", In: *Advanced Metallization and Interconnect Systems for ULSI Applications in 1995,* R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31, 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *J. Electrochem. Soc.*, 140, 2836–2843, (Oct. 1993).

Lu, N., et al., "The SPT Cell—A New Substrate–Plate Trench Cell for DRAMs", 1985 IEEE International Electron Devices Meeting, Technical Digest, Washington, D.C., 771–772, (Dec. 1–4, 1985).

MacSweeney, D., et al., "Modelling of Lateral Bipolar Devices in a CMOS Process", IEEE Bipolar Circuits and Technology Meeting, Minneapolis, MN, 27–30, (Sep. 1996).

Maeda, S., et al., "A Vertical Φ–Shape Transistor (VΦT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Φ–Shape Transistor (VΦT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New α–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", 1991 IEEE International Electron Devices Meeting, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Rao, K.V., et al., "Trench Capacitor Design Issues in VLSI DRAM Cells", 1986 IEEE International Electron Devices Meeting, Technical Digest, Los Angeles, CA, 140–143, (Dec. 7–10, 1986).

Richardson, W.F., et al., "A Trench Transistor Cross–Point DRAM Cell", 1985 IEEE International Electron Devices Meeting, Washington, D.C., 714–717, (Dec. 1–4, 1985).

Sagara, K., et al., "A 0.72 $\mu m^2$ Recessed STC (RSTC) Technology for 256Mbit DRAMs using Quarter–Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Shah, A.M., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", 1986 IEEE International Solid–State Circuits Conference, Digest of Technical Papers, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", 1997 IEEE International Solid–State Circuits Conference, Digest of Technical Papers, 68–69, (Feb. 6, 1997).

Stellwag, T.B., et al., "A Vertically–Integrated GaAs Bipolar DRAM Cell", *IEEE Transactions on Electron Devices*, 38, 2704–2705, (Dec. 1991).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sunouchi, K., et al., "A Surrounding Gate Transistor (SGT) Cell for 64/256Mbit DRAMs", 1989 IEEE International Electron Devices Meeting, Technical Digest, Washington, D.C., 23–26, (Dec. 3–6, 1989).

Sunouchi, K., et al., "Process Integration for 64M DRAM Using an Asymmetrical Stacked Trench Capacitor (AST) Cell", 1990 IEEE International Electron Devices Meeting, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tsui, P.G.Y., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices,* 38, 2487–2496, (Nov. 1991).

Wang, N., *Digital MOS Integrated Circuits,* Prentice Hall, Inc., Englewood Cliffs, NJ, pp. 328–333, (1989).

Wang, P.W., et al., "Excellent Emission Characteristics of Tunneling Oxides Formed Using Ultrathin Silicon Films for Flash Memory Devices", *Japanese Journal of Applied Physics,* 35, 3369–3373, (Jun. 1996).

Watanabe, H., et al., "A New Cylindrical Capacitor Using Hemispherical Grained Si (HSG–Si) for 256Mb DRAMs", IEEE International Electron Devices Meeting, Technical Digest, San Francisco, CA, 259–262, (Dec. 13–16, 1992).

Watanabe, S., et al., "A Novel Stacked Capacitor with Porous–Si Electrodes for High Density DRAMs", *1993 Symposium on VLSI Technology, Digest of Technical Papers,* Kyoto, Japan, 17–18, (1993).

Yamada, T., et al., "Spread Source/Drain (SSD) MOSFET Using Selective Silicon Growth for 64Mbit DRAMs", 1989 IEEE International Electron Devices Meeting, Technical Digest, Washington, D.C., 35–38, (Dec. 3–6, 1989).

Watanabe, H., et al., "An Advanced Fabrication Technology of Hemispherical Grained (HSG) Poly–Si for High Capacitance Storage Electrodes", Extended Abstracts of the 1991 International Conference on Solid State Devices and Materials, Yokohama, Japan, 478–480, (1991).

Watanabe, H., et al., "Device Application and Structure Observation for Hemispherical–Grained Si", *J. Appl. Phys.,* 71, 3538–3543, (Apr. 1992).

Watanabe, H., et al., "Hemispherical Grained Silicon (HSG–Si) Formation on In–Situ Phosphorous Doped Amorphous–Si Using the Seeding Method", Extended Abstracts of the 1992 International Conference on Solid State Devices and Materials, Tsukuba, Japan, 422–424, (1992).

Watanabe, H., et al., "A Novel Circuit Technology with Surrounding Gate Transistors (SGT's) for Ultra High Density DRAM's", *IEEE Journal of Solid–State Circuits,* 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices,* 38, 2481–2486, (Nov. 1991).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers,* Honolulu, HI, 240–241, (Jun. 11–13, 1996).

Hu, G., et al., "Evening Panel Discussion—Will Flash Memory Replace Hard Disk Drive", *IEDM Technical Digest,* (Dec. 11, 1994).

Hu, G., et al., "Will Flash Memory Replace Hard Disk Drive?", 1994 IEEE International Electron Device Meeting, San Francisco, CA, Panel Discussion, Session 24, Outline, 1 p. (Dec. 13, 1994).

Jung, T.–S., et al., "A 117–mm$^2$ 3.3–v Only 128–Mb Multilevel NAND Flash Memory for Mass Storage Applications", *IEEE Journal of Solid–State Circuits,* 31, 1575–1582 (Nov. 1996).

Pein, H., et al., "Performance of the 3–D PENCIL Flash EPROM Cell and Memory Array", *IEEE Transactions on Electron Devices,* 42, 1982–1991 (Nov. 1995).

Pein, H.B., et al., "Performance of the 3–D Sidewall Flash EPROM Cell", 1993 IEEE International Electron Devices Meeting, Technical Digest, Washington, D.C., 11–14 (Dec. 5–8, 1993).

Takato, H., et al., "High Performance CMOS Surrounding Gate Transistor (SGT) for Ultra High Density LSIs", 1988 IEEE International Electron Devices Meeting, Technical Digest, San Francisco, CA 222–225, (Dec. 11–14, 1988)

Pain, H. and J. Plummer IEDM 1993 pp. 2.1.1–2.1.4, 1993.

ULTRA HIGH DENSITY FLASH MEMORY

CROSS REFERENCE TO RELATED APPLICATIONS

This application is related to co-pending, commonly assigned patent application Ser. No. 08/889553, filed on even date herewith, which disclosure is herein incorporated by reference.

TECHNICAL FIELD OF THE INVENTION

This invention relates generally to integrated circuits, and particularly to floating gate transistor structures for use in nonvolatile semiconductor memories such as in flash EEPROM memory cells.

BACKGROUND OF THE INVENTION

Electrically erasable and programmable read only memories (EEPROMs) are reprogrammable nonvolatile memories that are widely used in computer systems for storing data both when power is supplied or removed. The typical data storage element of an EEPROM is a floating gate transistor, which is a field-effect transistor (FET) having an electrically isolated (floating) gate that controls electrical conduction between source and drain regions. Data is represented by charge stored on the floating gate and the resulting conductivity obtained between source and drain regions.

Increasing the storage capacity of EEPROM memories requires a reduction in the size of the floating gate transistors and other EEPROM components in order to increase the EEPROM's density. However, memory density is typically limited by a minimum lithographic feature size (F) that is imposed by lithographic processes used during fabrication. For example, the present generation of high density dynamic random access memories (DRAMs), which are capable of storing 256 Megabits of data, require an area of 8 $F^2$ per bit of data. There is a need in the art to provide even higher density memories in order to further increase storage capacity.

SUMMARY OF THE INVENTION

The present invention includes an ultra high density electrically erasable and programmable read only memory (EEPROM) providing increased nonvolatile storage capacity. The memory allows simultaneous erasure of multiple data bits, and is referred to as flash EEPROM. Both bulks semiconductor and semiconductor-on-insulator (SOI) embodiments are included.

In one embodiment of the invention, a memory cell includes a pillar of semiconductor material that extends outwardly from a working surface of a substrate. The pillar includes source/drain and body regions and has a number of sides. More than two floating gates are included in each memory cell. Each gate is associated with a side of the pillar. A number of control gates are also included in each memory cell. Each control gate is associated with a floating gate so as to allow selective storage and retrieval of data on the floating gates. In one embodiment, the control gate is capable of storing more than two charge states on its associated floating gate.

In another embodiment of the invention, a memory cell is fabricated upon a substrate. The memory cell includes a first conductivity type semiconductor pillar. The pillar has top and side surfaces and is formed upon the substrate. A first source/drain region, of a second conductivity type formed proximal to an interface between the pillar and the substrate. A second source/drain region, of a second conductivity type, is formed in a portion of the pillar that is distal to the substrate and separate from the first source/drain region. A gate dielectric is formed on at least a portion of the side surface of the pillar. More than two floating gates are formed, each of which is substantially adjacent to a portion of the side surface of the pillar and separated therefrom by the gate dielectric. A plurality of control gates are formed, each of which is substantially adjacent to one of the floating gates and insulated therefrom. An intergate dielectric is formed, interposed between each of the substantially adjacent floating and control gates.

In another embodiment of the invention a nonvolatile memory array is fabricated upon a substrate. The memory array includes a plurality of memory cells, each memory cell having a number of floating gate transistors. The memory array also includes a plurality of first gate lines that are substantially parallel in a first direction. Each first gate line interconnects ones of the control gates in one of the memory cells. A plurality of second gate lines are also formed. The plurality of second gate lines are substantially parallel in a second direction that is substantially orthogonal to the first direction. Each second gate line interconnects ones of the control gates in ones of the memory cells. At least one first source/drain interconnection line is formed at least partially within the substrate. The first source/drain interconnection line interconnects ones of the first source/drain regions of ones of the memory cells. A plurality of data lines is formed. Each data line interconnects ones of the second source/drain regions of ones of the memory cells.

In another embodiment, the present invention provides a method of forming a memory array. The method includes several steps, as described below. A plurality of first conductivity type semiconductor pillars are formed upon a substrate. Each pillar has top and side surfaces. A plurality of first source/drain regions, of a second conductivity type, are formed. Each of the first source/drain regions is formed proximally to an interface between the pillar and the substrate. A plurality of second source/drain regions, of a second conductivity type, is formed. Each of the second source/drain regions is formed within one of the pillars and distal to the substrate and separate from the first/source drain region. A gate dielectric is formed on at least a portion of the side surfaces of the pillars. A plurality of floating gates is formed. Each of the floating gates is formed substantially adjacent to a portion of the side surface of one of the pillars and separated therefrom by the gate dielectric. A plurality of control gates is formed. Each of the control gates is formed substantially adjacent to one of the floating gates and insulated therefrom. An intergate dielectric is formed, interposed between ones of the floating gates and ones of the control gates. A plurality of first gate lines is formed. The first gate lines are substantially parallel in a first direction. Each first gate line interconnects ones of the control gates. A plurality of second gate lines are formed, which are substantially parallel in a second direction that is substantially orthogonal to the first direction. Each second gate line interconnects ones of the control gates. At least one first source/drain interconnection line is formed at least partially within the substrate. The first source/drain interconnection line interconnects ones of the first source/drain regions. A plurality of data lines is formed. Each data line interconnects ones of the second/source drain regions.

In one embodiment, the method of forming a memory array on a substrate includes forming a first source/drain layer at a surface of the substrate. A semiconductor epitaxial layer is formed on the first source/drain layer. A second source/drain layer is formed at a surface of the epitaxial layer. A plurality of substantially parallel first troughs are etched, in a first direction, in the epitaxial layer. A first gate dielectric layer is formed substantially adjacent to sidewall regions of the first troughs. A first conductive layer is formed in the first troughs. A portion of the first conductive layer in the first troughs is removed, such that floating gate regions are formed along the sidewall regions therein and separated from the sidewall regions by the first gate dielectric layer. A portion of the substrate, underlying a portion of the first troughs and between the floating gate regions, is etched. A first intergate dielectric layer is formed on exposed portions of the floating gate regions in the first troughs. First gate lines are formed in the underlying etched portion of the substrate between opposing floating gate regions in the first troughs. Control gate regions are formed in the first troughs between opposing floating gate regions and separated therefrom by the first intergate dielectric layer.

A plurality of substantially parallel second troughs are etched, in a second direction that is substantially orthogonal to the first direction, in the epitaxial layer. A second gate dielectric layer is formed substantially adjacent to sidewall regions of the second troughs. A second conductive layer is formed in the second troughs. A portion of the second conductive layer in the second troughs is removed, such that floating gate regions are formed along the sidewall regions therein and separated from the sidewall regions by the second gate dielectric layer. A second intergate dielectric layer is formed on exposed portions of the floating gate regions in the second troughs. Control gate regions and second gate lines are formed between opposing floating gate regions in the second troughs and separated from the floating gate regions in the second troughs by the second intergate dielectric layer.

Thus, the present invention includes bulk semiconductor and semiconductor-on-insulator embodiments of an ultra high density flash EEPROM having increased nonvolatile storage capacity. If a floating gate transistor is used to store a single bit of data, an area of only $F^2$ is needed per bit of data, where F is the minimum lithographic feature size. If multiple charge states (more than two) are used, an area of less than $F^2$ is needed per bit of data. The increased storage capacity of the flash EEPROM is particularly advantageous in replacing hard disk drive data storage in computer systems. In such an application, the delicate mechanical components included in the hard disk drive are replaced by rugged, small, and durable solid-state flash EEPROM packages. The flash EEPROMs provide improved performance, extended rewrite cycles, increased reliability, lower power consumption, and improved portability.

BRIEF DESCRIPTION OF THE DRAWINGS

In the drawings, like numerals describe substantially similar components throughout the several views.

DETAILED DESCRIPTION OF THE INVENTION

Figure 1:
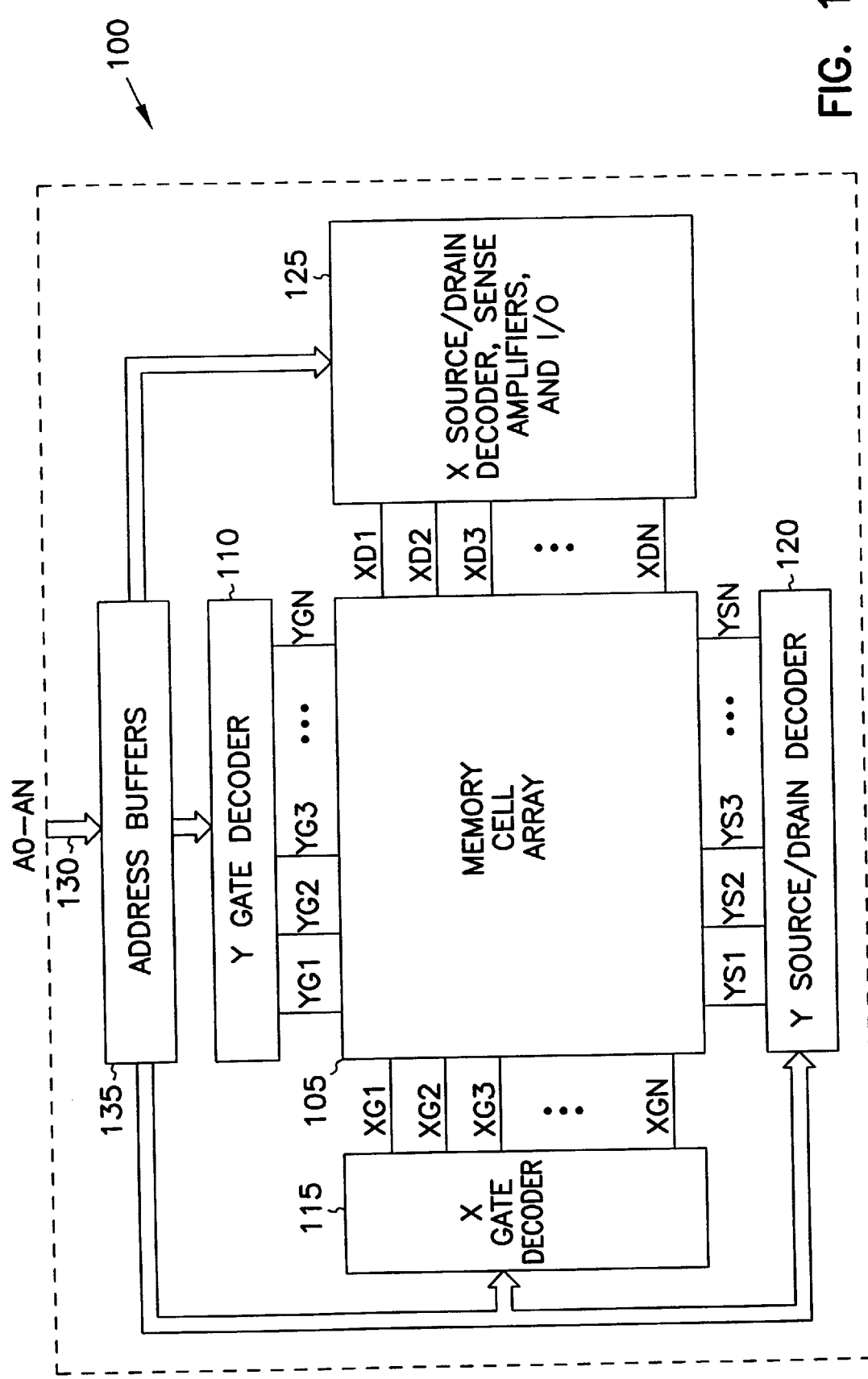
FIG. 1 is a schematic/block diagram illustrating generally an architecture of one embodiment of a nonvolatile memory, according to the teachings of the invention, including an array having a plurality of memory cells.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art, including bulk semiconductor and semiconductor-on-insulator (SOI) substrates. In the drawings, like numerals describe substantially similar components throughout the several views. The following detailed description is not to be taken in a limiting sense.

FIG. 1 is a schematic/block diagram illustrating generally an architecture of one embodiment of a memory 100 according to the present invention. In the embodiment of FIG. 1, memory 100 is a nonvolatile ultra high density electrically erasable and programmable read only memory (EEPROM) allowing simultaneous erasure of multiple data bits, referred to as flash EEPROM. However, the invention can be applied to other semiconductor memory devices, such as static or dynamic random access memories (SRAMs and DRAMs, respectively), synchronous random access memories or other types of memories that include a matrix of selectively addressable memory cells.

Memory 100 includes a memory cell array 105, having memory cell therein that include floating gate transistors, as described below. Y gate decoder 110 provides a plurality of first gate lines, YG1, YG2, . . . , YGN for addressing floating gate transistors in array 105, as described below. X gate decoder 115 provides a plurality of second gate lines, XG1, XG2, . . . , XGN for addressing floating gate transistors in array 105, as described below. Y source/drain decoder 120 provides a plurality of first source/drain interconnection lines YS1, YS2, . . . , YSN, for accessing first source/drain regions of the floating gate transistors in array 105, as described below. In an embodiment in which commonly connected first source/drain interconnection lines YS1, YS2, . . . , YSN are used, Y source/drain decoder 120 may be omitted. X source/drain decoder 125 provides a plurality of data lines, XD1, XD2, . . . , XDN for accessing second source/drain regions of the floating gate transistors in array 105, as described below. X source/drain decoder 125 also typically includes sense amplifiers and input/output (I/O) circuitry for reading, writing, and erasing data to and from array 105. In response to address signals A0–AN that are provided on address lines 130 during read, write, and erase operations, address buffers 135 control the operation of Y gate decoder 110, X gate decoder 115, Y source/drain decoder 120, and X source/drain decoder 125. The address signals A0–AN are provided by a controller such as a microprocessor that is fabricated separately or together with memory 100, or otherwise provided by any other suitable circuits. As described in detail below, the address signals A0–AN are decoded by Y gate decoder 110, X gate decoder 115, Y source/drain decoder 120, and X source/drain decoder 125 to perform reading, writing, and erasing operations on memory cells that include a number of vertical floating gate field-effect transistors (FETs) formed on the sides of a semiconductor pillar on a substrate.

Figure 2:
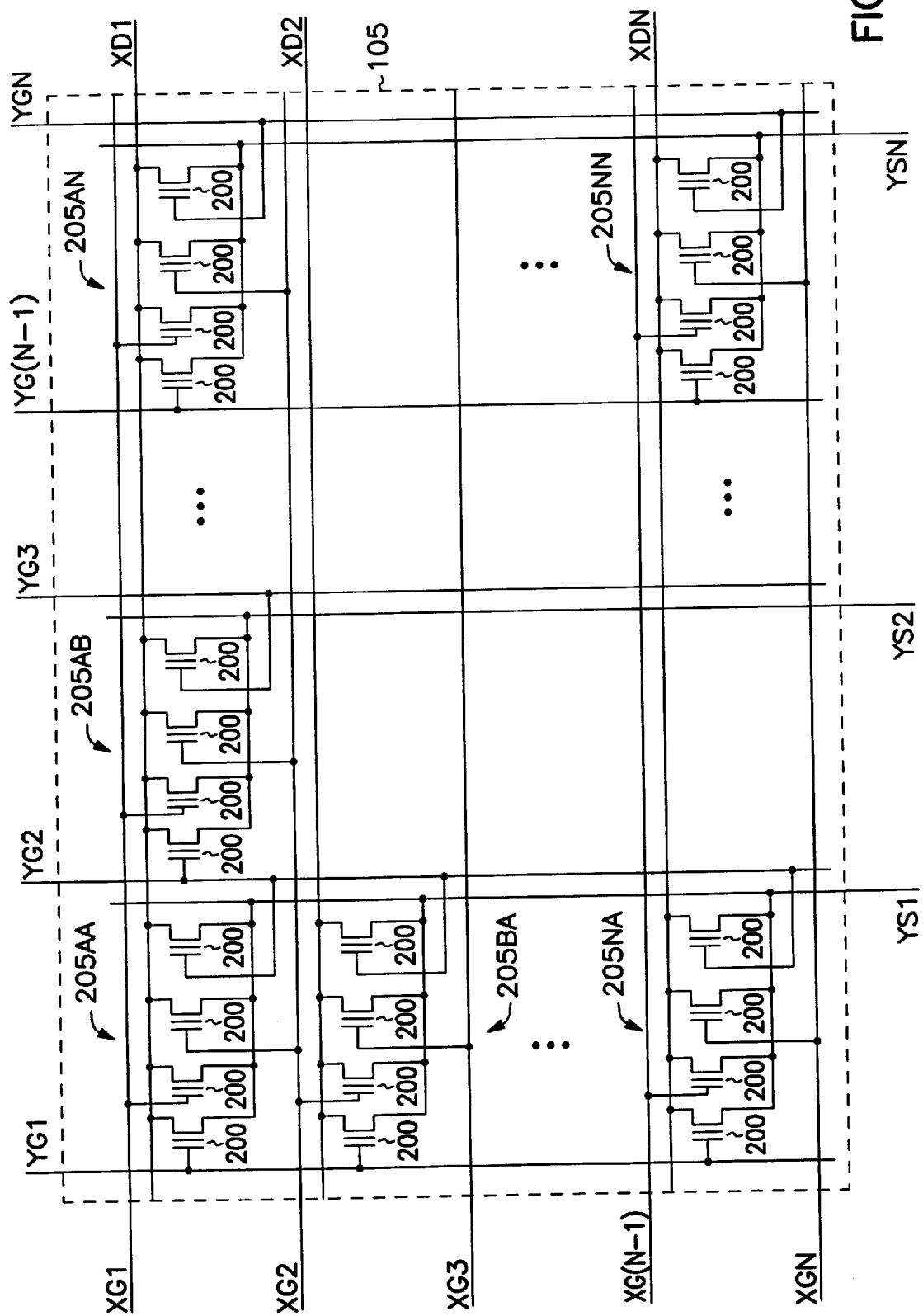
FIG. 2 is a schematic diagram illustrating generally one embodiment of an array of memory cells according to the teachings of the invention.

FIG. 2 is a schematic diagram illustrating generally one embodiment of array 105 in more detail. In FIG. 2, each memory cell 205 comprises four floating gate transistors 200, e.g. four field-effect transistors (FETs), each having an electrically isolated (floating) gate that controls electrical conduction between source and drain regions. The floating gate transistors 200 are arranged in cells 205, such as cells 205AA, 205BA, . . . , 205NA, in a first direction, e.g. in the Y-direction of the first source/drain interconnection lines YS1, YS2, . . . , YSN, and in cells such as 205AA, 205AB, . . . , 205AN in a second direction, e.g. in the X-direction of the data lines, XD1, XD2, . . . , XDN. In the embodiment of FIG. 2, each cell 205 includes four floating gate transistors 200 that share a common first source/drain region, such as a source region coupled to one of the first source/drain interconnection lines YS1, YS2, . . . , YSN. The floating gate transistors 200 of each cell 205 also share a common second source/drain region, such as a drain region coupled to one of the data lines, XD1, XD2, . . . , XDN. Each cell 205 has first and second source/drain regions that are fabricated using a common semiconductor pillar on a substrate, as explained below.

Figure 3:
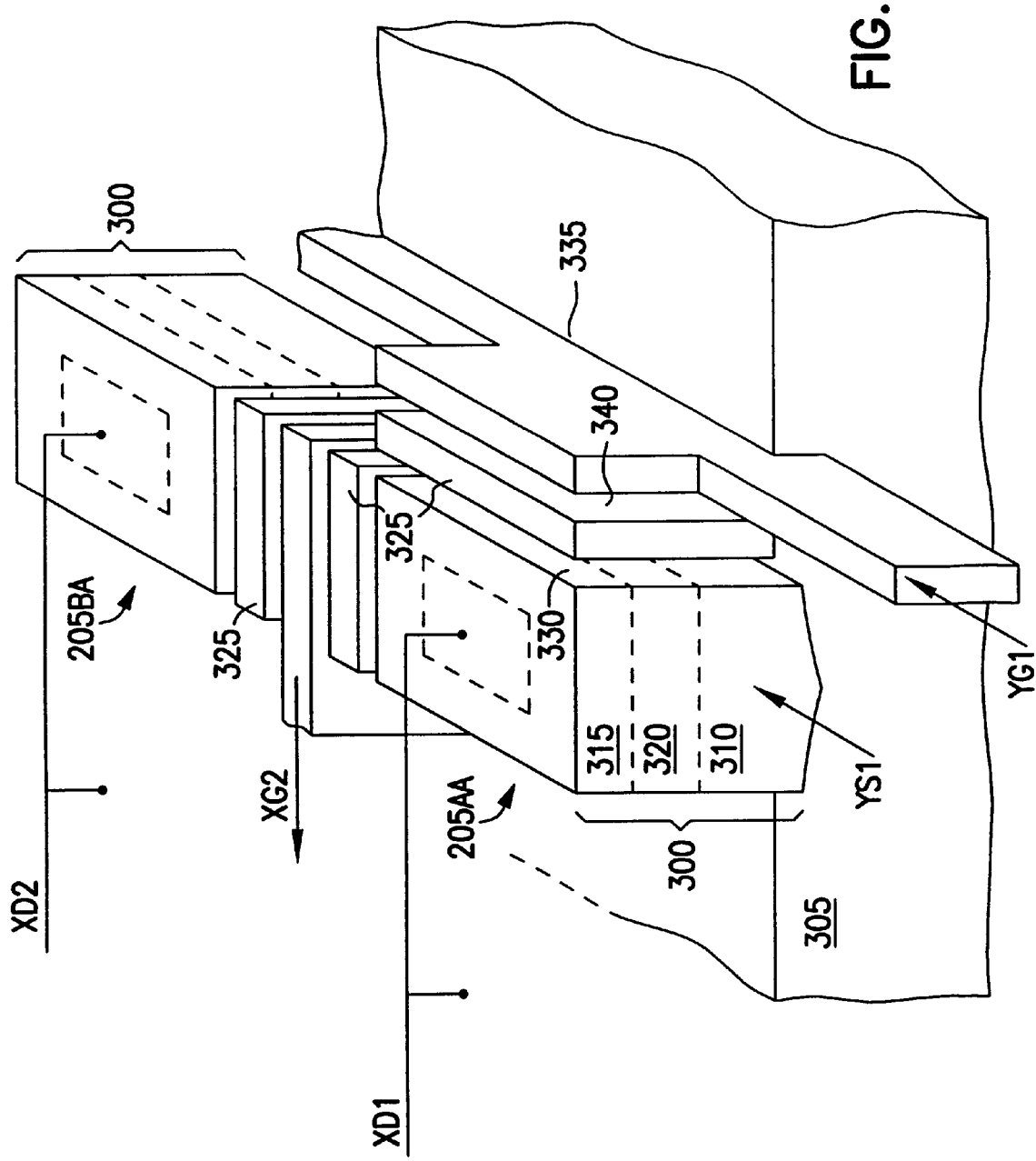
FIG. 3 is a perspective view illustrating generally one embodiment of a portion of an array of memory cells according to the teachings of the invention.

FIG. 3 is a perspective view illustrating generally one embodiment of a portion of array 105, including portions of two cells 205 of floating gate transistors 200, such as illustrated in FIG. 2. In FIG. 3, the substantially identical cells 205 are illustrated by way of example through cells 205AA and 205BA. Cells 205AA and 205BA each include a semiconductor pillar 300, initially of a first conductivity type such as P− silicon, fabricated upon a monolithic substrate 305. In one embodiment, substrate 305 is a bulk semiconductor, such as P− silicon. In another embodiment, a semiconductor-on-insulator (SOI) substrate 305 includes an insulating layer, such as silicon dioxide ($SiO_2$), as described below.

Each pillar 300 includes a first source/drain region of a second conductivity type, such as N+ silicon source region 310, formed proximally to a sub-micron dimensioned interface between pillar 300 and substrate 305. Each pillar 300 also includes a second source/drain region of the second conductivity type, such as N+ silicon drain region 315, that is distal to substrate 305, and separated from source region 310 by a first conductivity type region, such as P− body region 320.

Each pillar 300 provides a source region 310, a drain region 315, and a body region 320 for the four floating gate transistors 200 of a particular memory cell 205. In one embodiment, the physical dimensions of each pillar 300 and the doping of P-body region 320 are both sufficiently small to allow operation of the floating gate transistors 200 that is characteristic of fully depleted body transistors. First source/drain region interconnection line YS1 electrically interconnects the source region 310 of each pillar 300 of cells 205AA, 205BA, . . . , 205BN. In one embodiment, the first source/drain interconnection lines YS1, YS2, . . . , YSN, comprise a conductively doped semiconductor of the second conductivity type, such as N+ silicon, disposed at least partially within substrate 305. For example, dopants can be ion-implanted or diffused into substrate 305 to form the first source/drain interconnection lines YS1, YS2, . . . , YSN. In another embodiment, the first source/drain interconnection lines YS1, YS2, . . . , YSN are formed above substrate 305. For example, a doped epitaxial semiconductor layer can be grown on substrate 305, from which first source/drain interconnection lines YS1, YS2, . . . , YSN are formed. Alternatively, an undoped epitaxial semiconductor layer can be grown on substrate 305, and dopants then introduced by ion-implantation or diffusion to obtain the first source/drain interconnection lines YS1, YS2, . . . , YSN of the desired conductivity.

Each pillar 300 is outwardly formed from substrate 305, and is illustrated in FIG. 3 as extending vertically upward from substrate 305. Each pillar 300 has a top region that is separated from substrate 305 by four surrounding side regions. A floating gate 325 is formed substantially adjacent to each side surface of pillar 300, and separated therefrom by a gate dielectric 330, such that there are four floating gates 325 per pillar 300, though FIG. 3 omits some of the floating gates 325 for clarity of illustration. Each floating gate 325 has a corresponding substantially adjacent control gate 335, from which it is separated by an intergate dielectric 340. Except at the periphery of array 105, each control gate 335 is interposed between two approximately adjacent pillars 300 and shared by two floating gate transistors 200, each of these floating gate transistors 200 having portions in one of the two approximately adjacent pillars 300.

Also interposed between approximately adjacent pillars 300, except at the periphery of array 105, are first gate lines YG1, YG2, . . . , YGN that are substantially parallel to each other in the first direction, e.g. the Y-direction. Each of the first gate lines YG1, YG2, . . . , YGN interconnects ones of the control gates 335. For example, first gate line YG1 electrically interconnects control gates 335 of floating gate transistors 200 in cells 205AA, 205BA, . . . , 205BN. In the embodiment of FIG. 3, the first gate lines YG1, YG2, . . . , YGN are disposed at least partially within substrate 305, as described below.

Also interposed between approximately adjacent pillars 300, except at the periphery of array 105, are second gate lines XG1, XG2, . . . , XGN that are substantially parallel to each other in the second direction, e.g. the X-direction. Each of the second gate lines XG1, XG2, . . . , XGN interconnects ones of the control gates 335. For example, second gate line XG2 electrically interconnects control gates 335 of floating gate transistors 200, in which the control gates are shared between pairs of cells 205, e.g. 205AA and 205BA, 205AB and 205BB, . . . , 205AN and 205BN. In the embodiment of FIG. 3, the second gate lines XG1, XG2, . . . , XGN are disposed above substrate 305, as described below.

Drain regions 315 of the pillars 300 are interconnected by data lines XD1, XD2, . . . , XDN that are substantially parallel to each other in the second direction, e.g. the X-direction. FIG. 3 illustrates, by way of example, data lines XD1 and XD2, which are shown schematically for clarity. However, it is understood that data lines XD1, XD2, . . . , XDN comprise metal or other interconnection lines that are isolated from the underlying topology, e.g. pillars 300, floating gates 325, control gates 335, first gate lines YG1, YG2, . . . , YGN, and second gate lines XG1, XG2, . . . , XGN, by an insulating layer through which contact holes are etched to access the drain regions 315 of the pillars 300.

Figure 4:
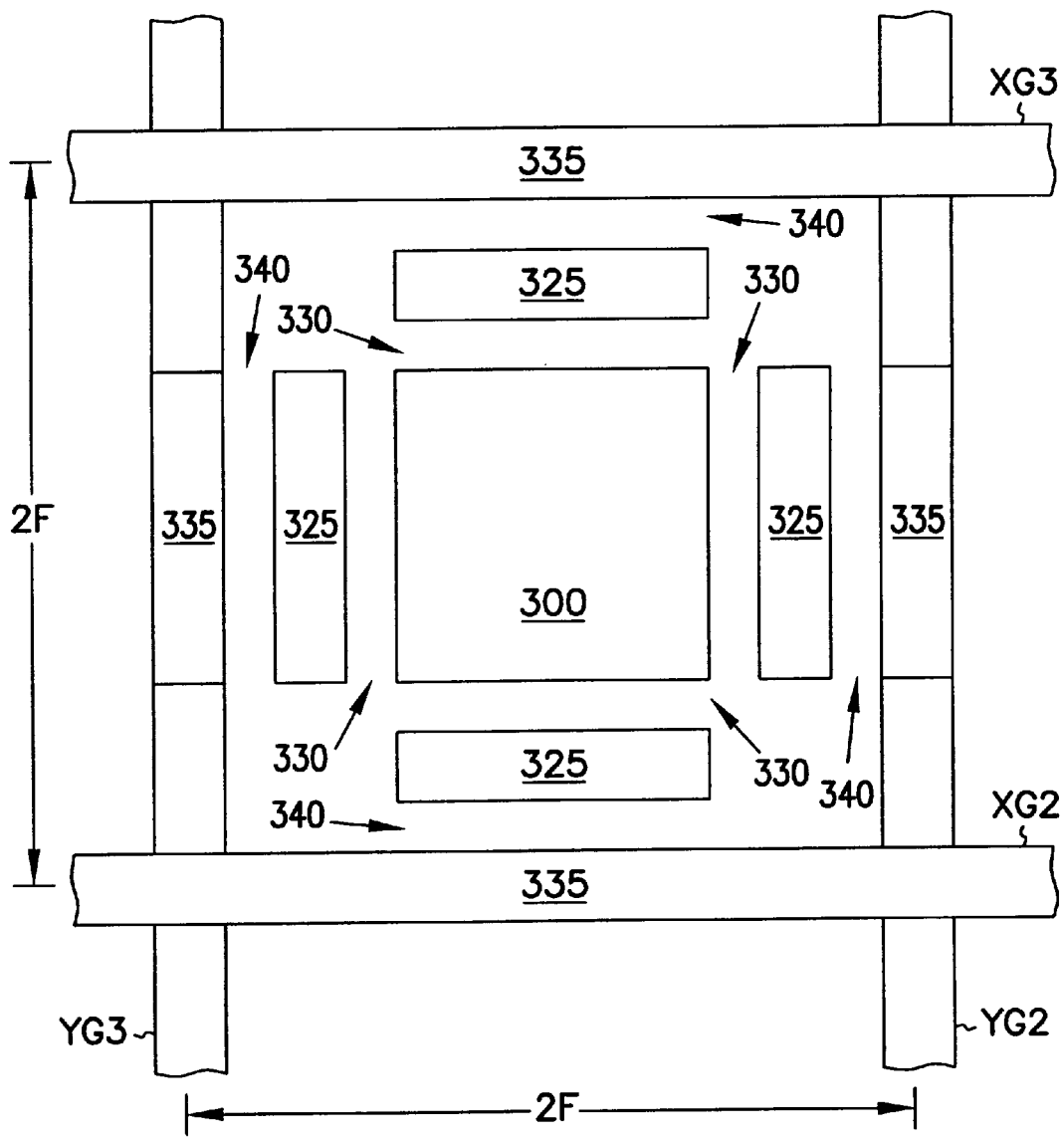
FIG. 4 is a plan view from above of a working surface of a substrate, which illustrates one embodiment of one of a memory cell according to the teachings of the invention.

FIG. 4 is a plan view, looking toward the working surface of substrate 305, illustrating generally by way of example one embodiment of one of cells 205 of four floating gate transistors 200, such as cell 205BB. In FIG. 4, each of the four floating gates 325 is adjacent to one side of pillar 300, and separated therefrom by gate dielectric 330. Each control gate 335 is separated from a corresponding floating gate 325 by an intergate dielectric 340, and is integrally formed together with one of the first gate lines YG1, YG2, . . . , YGN or second gate lines XG1, XG2, . . . , XGN. The control gates 335 that are integrally formed together with ones of the first gate lines YG1, YG2, . . . , YGN protrude upwardly therefrom such that an overlap capacitance is created with floating gates 325 that are disposed on either side thereof.

The center-to-center spacing ("pitch") between adjacent first gate lines YG1, YG2, . . . , YGN, such as between YG2 and YG3, or between adjacent second gate lines XG1, XG2, . . . , XGN, such as between XG2 and XG3, is twice the minimum lithographic feature size F. Since four floating gate transistors 200 are contained within a cell 205 having an area of 4 $F^2$, an area of only $F_2$ is needed per bit of data. In another embodiment, multiple charge states (more than two) are used to obtain correspondingly higher data storage densities, such that an area of less than $F^2$ is needed per bit of data, since more than one bit of data can be stored on a single floating gate transistor 200. In one embodiment, four charge states are used to store two bits of data per floating gate transistor 200, corresponding to eight bits of data per memory cell 205. One example of using more than two charge states to store more than one bit of data per transistor is set forth an article by T.-S. Jung et al., entitled "A 117-mm$^2$ 3.3-V Only 128-Mb Multilevel NAND Flash Memory For Mass Storage Applications," *IEEE J. Solid-State Circuits*, Vol. 31, No. 11, November 1996. In a further embodiment, a continuum of charge states is used to store analog data in array 105.

In one embodiment, programming of one of the floating gate transistors 200 is by hot electron injection. For example, a voltage of approximately 10 volts is provided, such as by one of Y gate decoder 110 or X gate decoder 115, through a particular one of the first gate lines YG1, YG2, . . . , YGN or second gate lines XG1, XG2, . . . , XGN to a particular control gate 335. A resulting inversion region (channel) is formed in the body region 320 at the surface that is approximately adjacent to the particular one of the first gate lines YG1, YG2, . . . , YGN or second gate lines XG1, XG2, . . . , XGN. A voltage of approximately 5 Volts is provided, such as by X source/drain decoder 125, through a particular one of data lines XD1, XD2, . . . , XDN to a particular drain region 315. A voltage of approximately 0 Volts is provided, such as by Y source/drain decoder 120, through a particular one of first source/drain interconnection lines YS1, YS2, . . . , YSN, to the particular source region 310 of the floating gate transistor 200. Electrons are injected onto the floating gate 325 interposed between the control gate 335 and the pillar 300 in which the particular drain region 315 is disposed. The exact value of the voltages provided to the particular control gate 335 and drain region 315 will depend on the physical dimension of the floating gate transistor 200, including the thickness of the gate dielectric 330, the thickness of the intergate dielectric 340, and the separation between source region 310 and drain region 315. Alternatively, if higher voltages are provided to control gate 335, and the gate dielectric 330 and intergate dielectric 340 are made thinner, the floating gate transistor 200 may be programmed instead by Fowler-Nordheim tunneling of electrons from the body region 320, source region 310, or drain region 315.

Addressing a particular memory cell 205 for reading data includes selecting a particular one of data lines XD1, XD2, . . . , XDN and also selecting a particular one of first source/drain interconnection lines YS1, YS2, . . . , YSN. Addressing a particular floating gate transistor 200 within the particular memory cell 205 for reading data further includes selecting a particular one of first gate lines YG1, YG2, . . . , YGN or second gate lines XG1, XG2, . . . , XGN.

In one embodiment, reading data stored on a particular floating gate transistor 200 includes providing a voltage of approximately 5 volts, such as by one of Y gate decoder or X gate decoder 115, through a particular one of the first gate lines YG1, YG2, . . . , YGN or second gate lines XG1, XG2, . . . , XGN to the particular control gate 335 of the floating gate transistor 200. A voltage of approximately 0 Volts is provided, such as by Y source/drain decoder 120, through a particular one of first source/drain interconnection lines YS1, YS2, . . . , YSN, to the particular source region 310 of the particular floating gate transistor 200. A particular one of data lines XD1, XD2, . . . , XDN that is switchably coupled to the drain region 315 of the floating gate transistor 200 is precharged to a positive voltage by a sense amplifier in X source/drain decoder 125, then coupled to the drain region 315 to determine the conductivity state of the floating gate transistor 200 between its source region 310 and drain region 315.

If there are no electrons stored on the floating gate 325, the floating gate transistor 200 will conduct between its source region 310 and drain region 315, decreasing the voltage of the particular one of data lines XD1, XD2, . . . , XDN toward that voltage of its source region 310, e.g. toward a "low" binary logic level of approximately 0 Volts. If there are electrons stored on the floating gate 325, the floating gate transistor 200 will not conduct between its source region 310 and drain region 315. As a result, the sense amplifier will tend to increase the voltage of the particular one of data lines XD1, XD2, . . . , XDN toward a positive voltage, e.g. toward a "high" binary logic voltage level.

In one embodiment, erasure of floating gate transistors 200 includes providing an erasure voltage difference of approximately between −10 and −12 Volts from a source region 310 to a corresponding control gate 335. For example, a voltage of approximately 0 Volts is provided, such as by Y source/drain decoder 120, to source regions 310 of floating gate transistors 200 that are interconnected by one or several first source/drain interconnection lines YS1, YS2, . . . , YSN. A voltage of approximately between −10 and −12 Volts is provided, such as by one of Y gate decoder 110 or X gate decoder 115, through a corresponding one or several of the first gate lines YG1, YG2, . . . , YGN or second gate lines XG1, XG2, . . . , XGN to the control gates 335 of the floating gate transistors 200 to be erased. As a result of the negative voltage applied to the control gates 335, electrons are removed from the corresponding floating gates 325 by Fowler-Nordheim tunneling, thereby erasing the data from ones of the floating gate transistors 200. In another example, a voltage of approximately between −5 and −6 Volts is applied to the control gates 335 and a voltage of approximately between +5 and +6 Volts is applied to the source regions 310 in order to obtain the erasure voltage difference of approximately between −10 and −12 Volts from a source region 310 to a corresponding control gate 335. The exact value of the erasure voltage difference will vary depending upon the physical dimensions of the floating gate transistor 200 and the thicknesses of gate dielectric 330 and intergate dielectric 340.

In one embodiment, the entire array 105 of floating gate transistors 200 is simultaneously erased by applying approximately between −10 and −12 Volts to each of first gate lines YG1, YG2, . . . , YGN and second gate lines XG1, XG2, . . . , XGN, and also applying 0 Volts to each of first source/drain interconnection lines YS1, YS2, . . . , YSN. In another embodiment, one or more sectors of array 105 are simultaneously erased by selectively applying approximately between −10 and −12 Volts to one or more of first gate lines YG1, YG2, . . . , YGN or second gate lines XG1, XG2, . . . , XGN, and also applying 0 Volts to one or more of first source/drain interconnection lines YS1, YS2, . . . , YSN.

FIGS. 5–20 illustrate generally one embodiment of a method of forming memory array 105. In this embodiment, the array 105 is formed using bulk silicon processing techniques and is described, by way of example, with respect to a particular technology having a minimum feature size F, which is also sometimes referred to as a critical dimension (CD), of 0.4 microns. However, the process steps described below can be scaled accordingly for other minimum feature sizes without departing from the scope of the invention.

Figure 5:
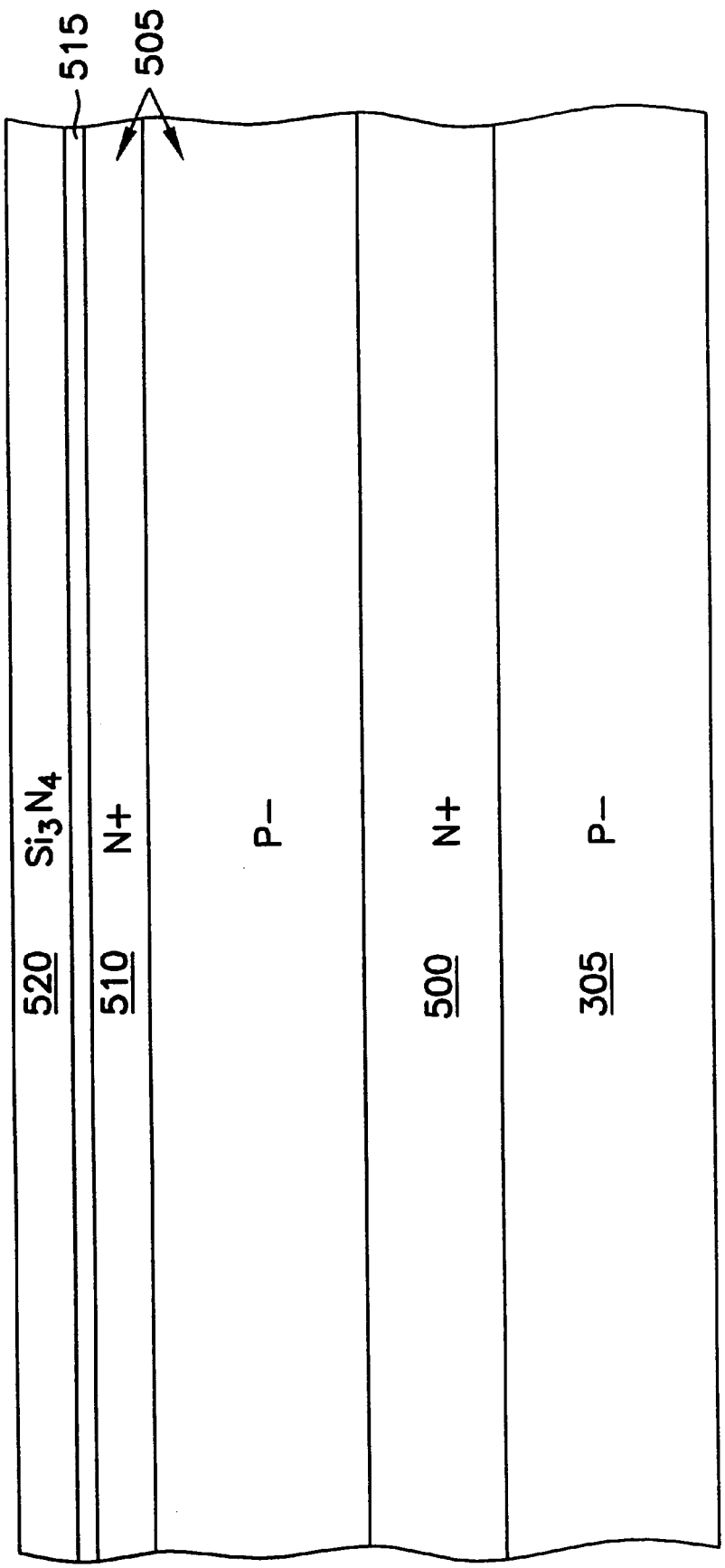
FIGS. 5–20 illustrate generally various stages of one embodiment of a method of forming an array of memory cells according to the teachings of the invention.

In FIG. 5, a P− silicon starting material is used for substrate 305. A first source/drain layer 500, of approximate thickness between 0.2 microns and 0.5 microns, is formed at a working surface of substrate 305. In one embodiment, first source/drain layer 500 is N+ silicon formed by ion-implantation of donor dopants into substrate 305. In another embodiment, first source/drain layer 500 is N+ silicon formed by epitaxial growth of silicon upon substrate 305. On the first source/drain layer 500, a semiconductor epitaxial layer 505, such as P− silicon of 0.6 micron approximate thickness, is formed, such as by epitaxial growth. A second source/drain layer 510, such as N+ silicon of 150 nanometer approximate thickness, is formed at a surface of the epitaxial layer 505, such as by ion-implantation of donor dopants into P− epitaxial layer 505 or by epitaxial growth of N+ silicon on P-epitaxial layer 505. A thin layer of silicon dioxide ($SiO_2$), referred to as pad oxide 515, is deposited on the second source/drain layer 510. Pad oxide 515 has a thickness of approximately 10 nanometers. A layer of silicon nitride ($Si_3N_4$), referred to as pad nitride 520, is deposited on the pad oxide 515. Pad nitride 520 has a thickness of approximately 200 nanometers.

Figure 6:
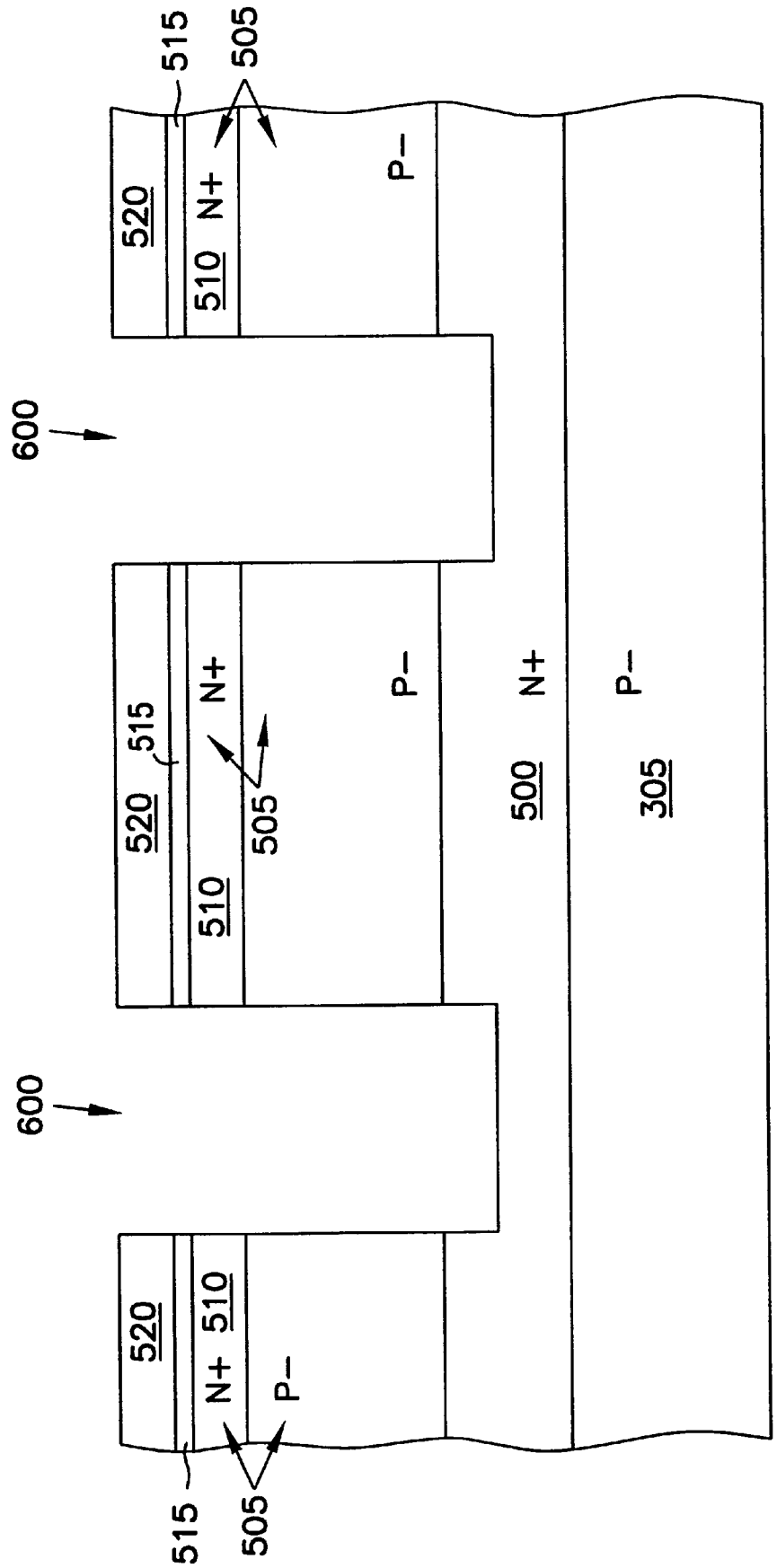

In FIG. 6, photoresist masking and selective etching techniques are used to form, in the first direction (e.g., the Y direction, which is perpendicular to the plane of the drawing of FIG. 6), a plurality of substantially parallel first troughs 600 that extend through the pad nitride 520, pad oxide 515, second source/drain layer 510, the underlying portion of epitaxial layer 505, and at least partially into first source/drain layer 500. The photoresist is then removed.

Figure 7:
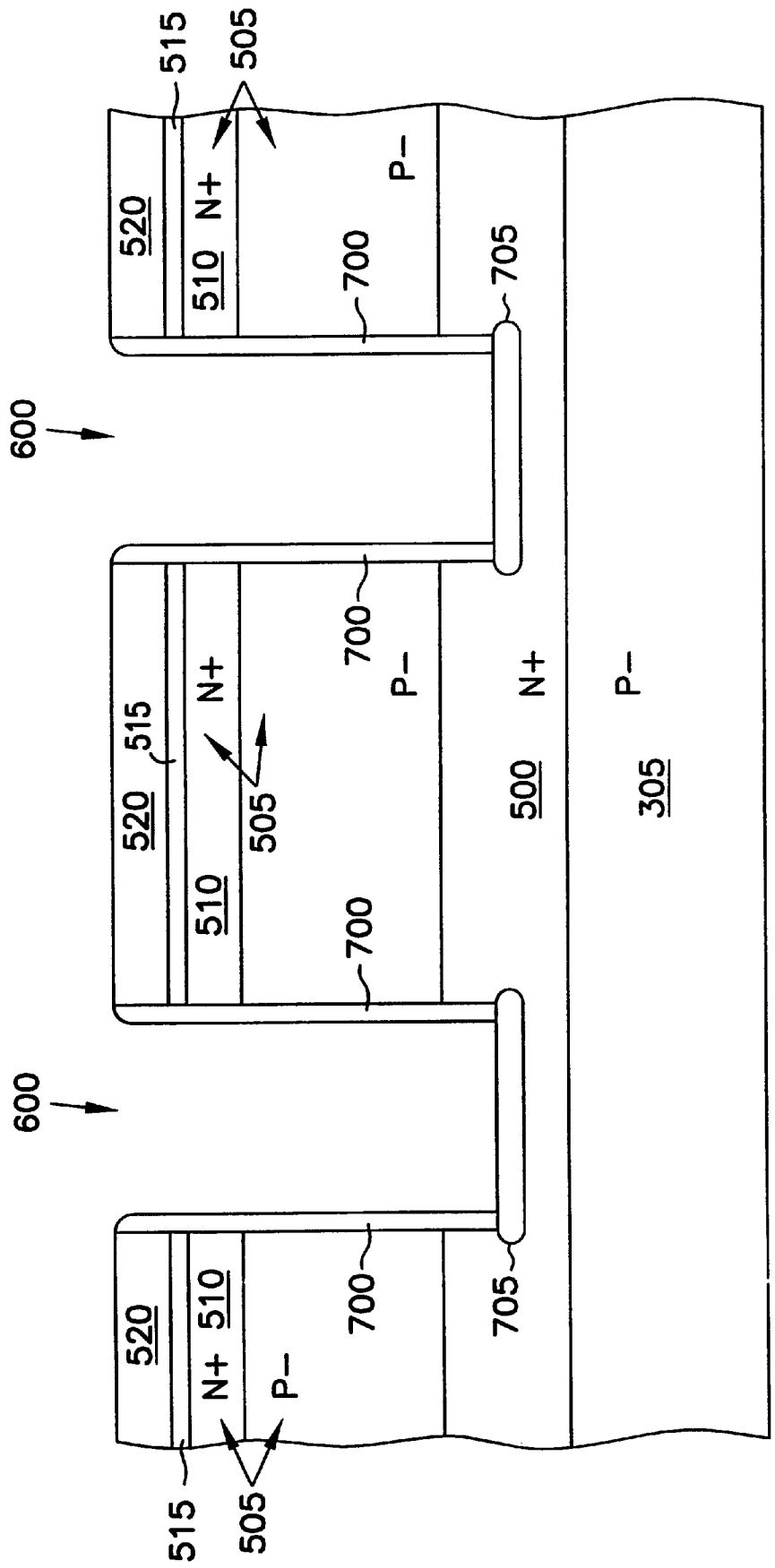

In FIG. 7, a thin silicon nitride oxidation barrier layer 700 is deposited by chemical vapor deposition (CVD) to protect against oxidation of sidewalls of first troughs 600. Barrier layer 700 is anisotropically etched to expose bottom portions of first troughs 600. A bottom insulation layer 705 of silicon dioxide is formed on the bottoms of first troughs 600 by thermal oxidation of the exposed bottom portions of first troughs 600.

Figure 8:
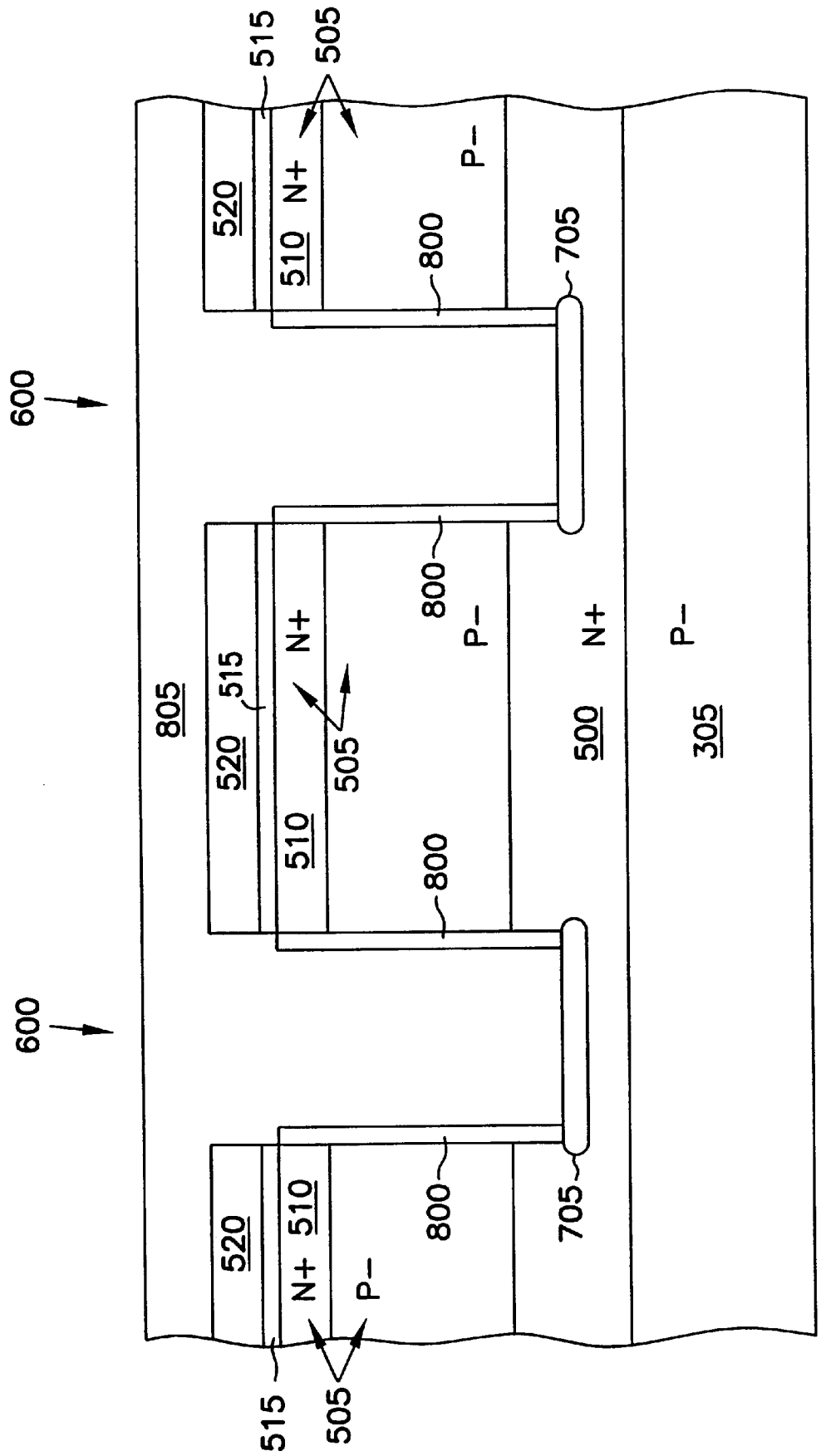

In FIG. 8, barrier layer 700 is stripped from the sidewalls of the first troughs 600, such as by a brief phosphoric acid etch, which is timed to expose the sidewalls of the first troughs 600 but which avoids significant removal of the pad nitride 520. A first gate dielectric layer 800 such as, for example, silicon dioxide of thickness approximately between 5 nanometers and 10 nanometers (sometimes referred to as "tunnel oxide"), is formed substantially adjacent to the exposed sidewalls of the first troughs 600. A first conductive layer 805, such as N+ doped polysilicon, is formed in the first troughs 600, such as by CVD, to fill the first troughs 600. The first conductive layer 805 is planarized, such as by chemical mechanical polishing (CMP) or other suitable planarization technique.

Figure 9:
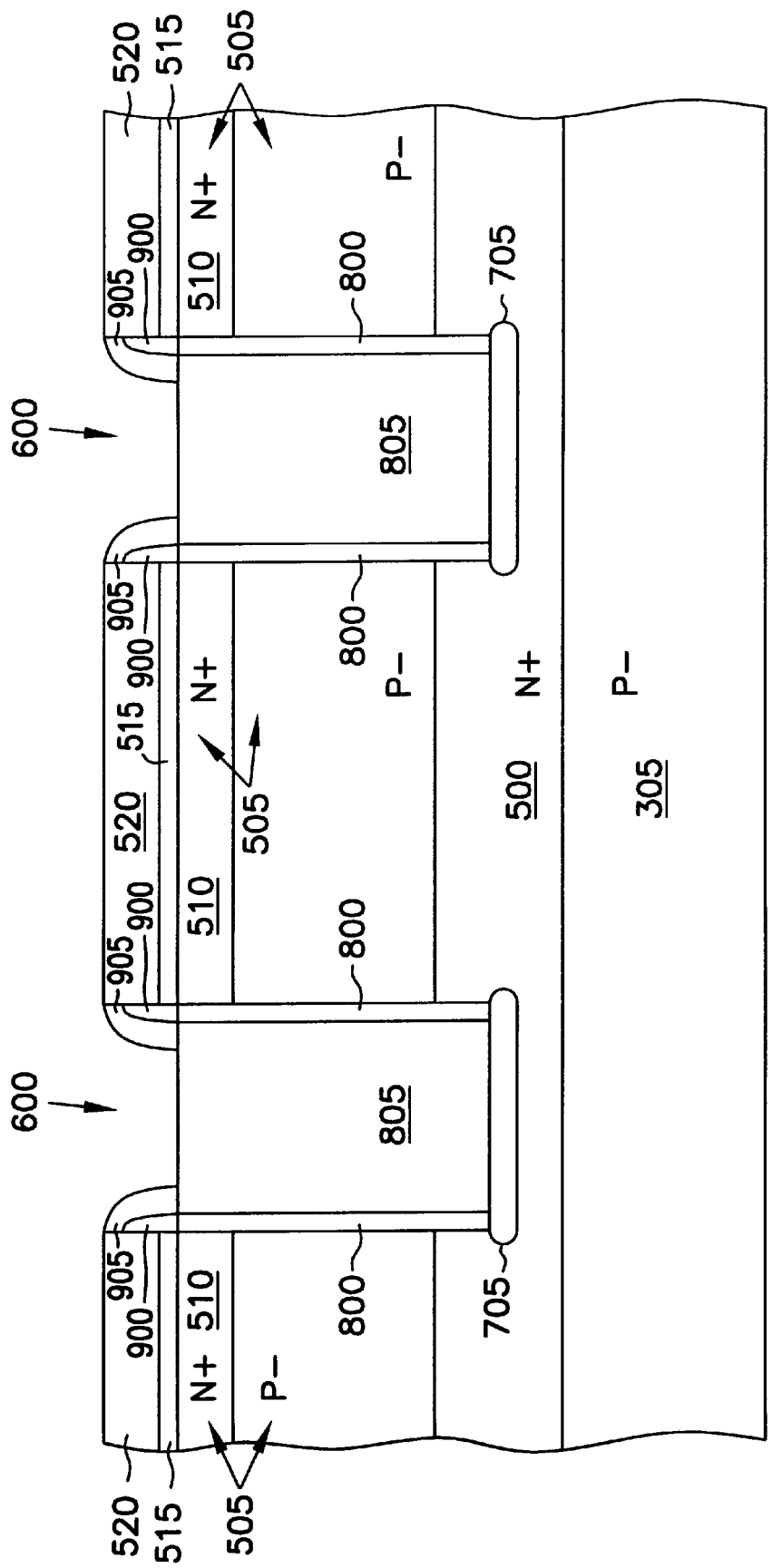

In FIG. 9, the first conductive layer 805 is etched back in the first troughs 600 to approximately 100 nanometers below the silicon surface, which is defined by the interface between the second source/drain layer 510 and the pad oxide 515 layer. A first spacer layer, such as silicon nitride of an approximate thickness of 7 nanometers, is deposited by CVD and anisotropically etched by reactive ion etching (RIE) to leave nitride first spacers 900 along the sidewalls of the first troughs 600. A second spacer layer, such as silicon dioxide of an approximate thickness, of 90 nanometers, is deposited by CVD and anisotropically etched by RIE to leave second spacers 905 along the sidewalls of the first troughs 600.

Figure 10:
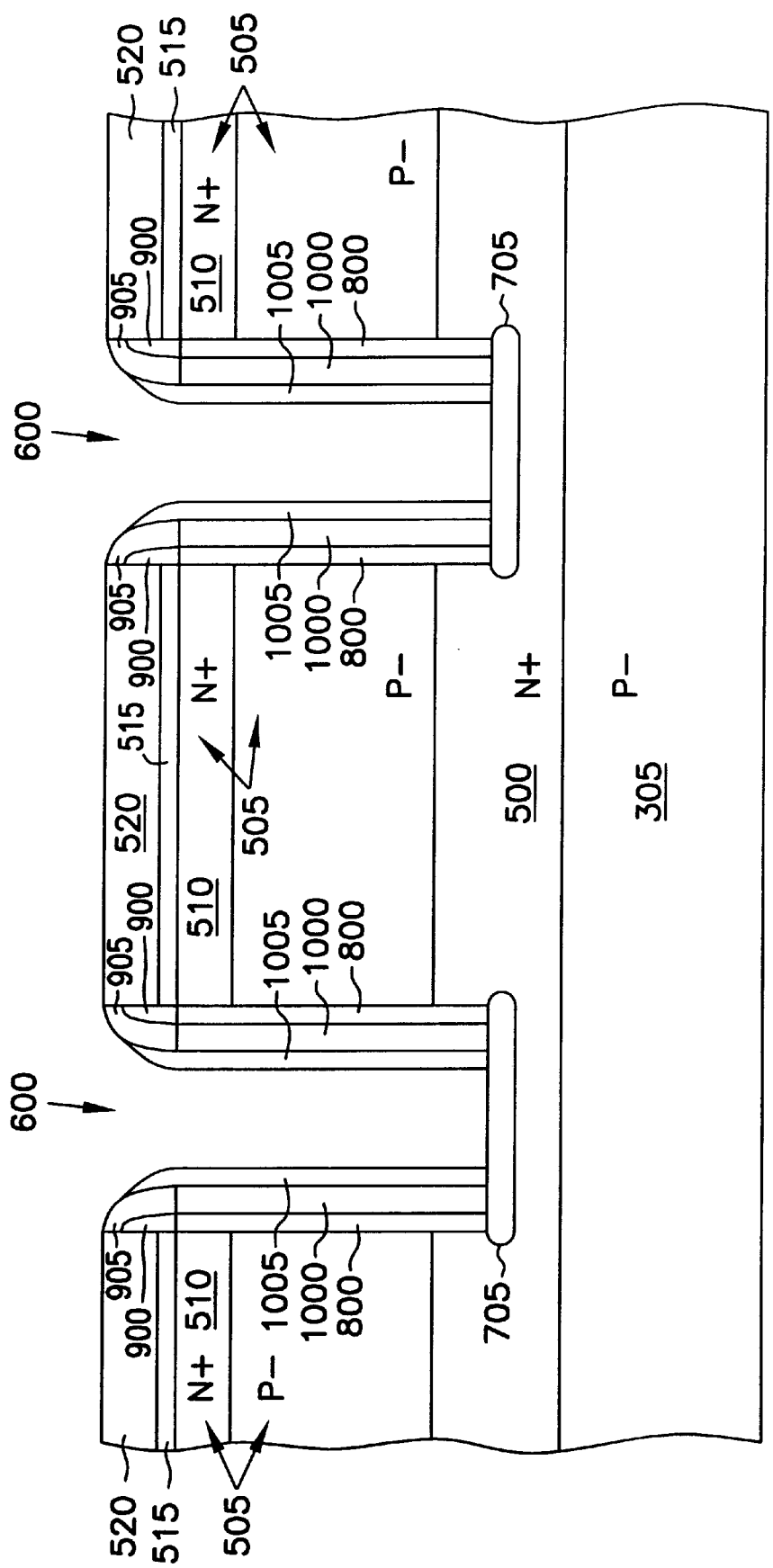

In FIG. 10, a portion of the first conductive layer 805 in first troughs 600 between second spacers 905 is removed, such as by using spacers 905 as a mask while etching down to bottom insulation layer 705, thereby forming from the first conductive layer 805 floating gate regions 1000 along the sidewalls of the first troughs 600. A thin oxidation barrier layer 1005, such as silicon nitride of approximate thickness of 5 nanometers, is deposited by CVD. Barrier layer 1005 is removed from the bottom insulation layer 705 in first troughs 600 by anisotropic etching. The remaining portions of barrier layer 1005 protect the floating gate regions 1000 during subsequent processing described below.

Figure 11:
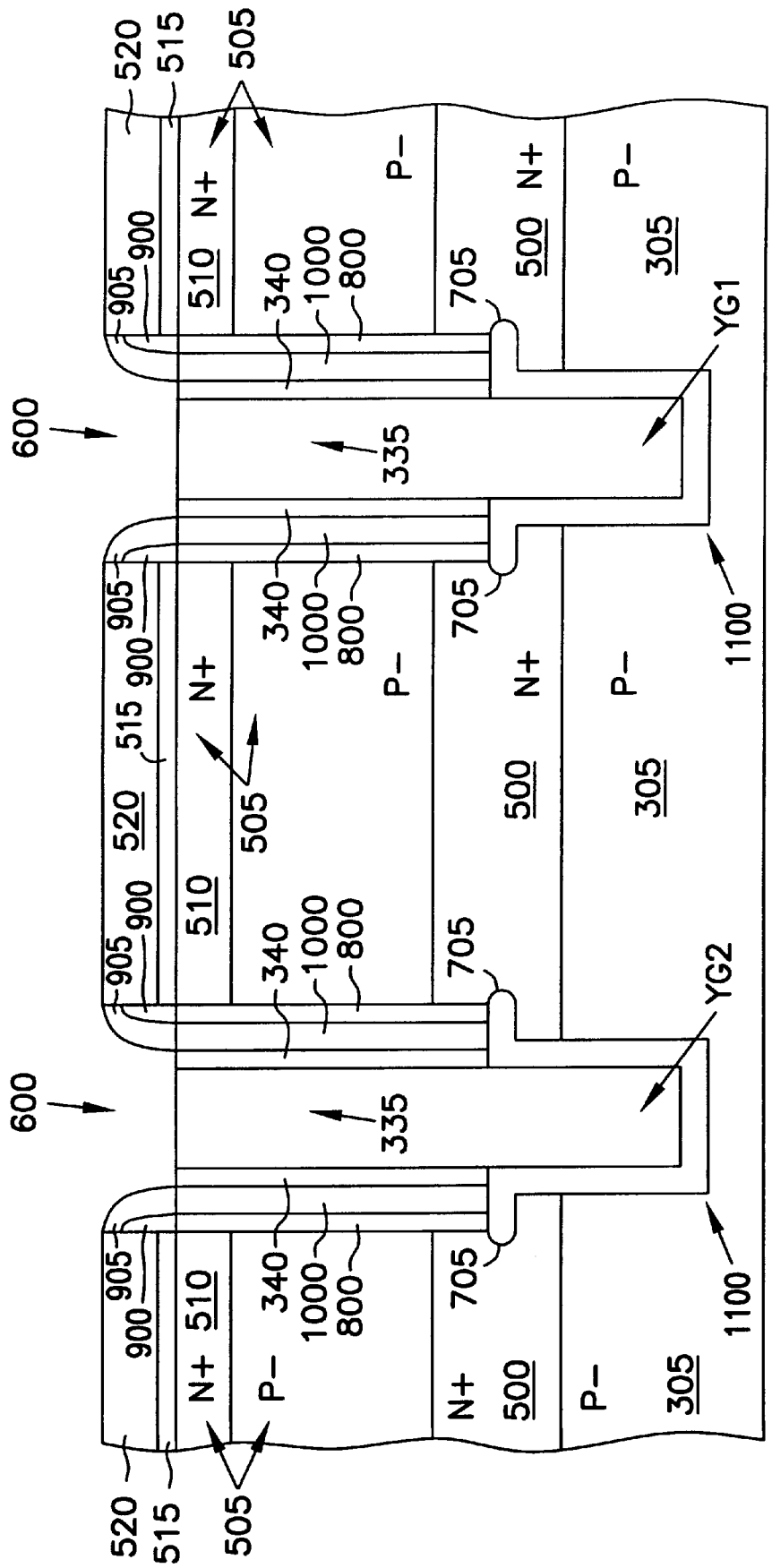

In FIG. 11, a portion of the bottom insulation layer 705 is removed, exposing a portion of the underlying substrate 305, by an anisotropic etch that is timed to leave enough of second spacers 905 to protect floating gate regions 1000 during a subsequent etch of substrate 305. A portion of substrate 305 that underlies a portion of first troughs 600 between the floating gate regions 1000 is removed by selectively anisotropically etching the substrate 305 to a depth sufficient to carry the first gate lines YG1, YG2, . . . , YGN. A first trough insulation layer 1100 is formed on sidewall and bottom regions of the etched portions of substrate 305 underlying the first troughs 600. Barrier layer 1005 is removed to expose the floating gate regions 1000 in first troughs 600, such as by wet etching.

The first intergate dielectric 340, having an approximate thickness between 7 nanometers and 15 nanometers, is formed on the exposed portions of floating gate regions 1000. In one embodiment, a silicon dioxide intergate dielectric 340 is formed by thermal oxidation of the floating gate regions 1000. In another embodiment, an oxynitride intergate dielectric 340 is formed on the floating gate regions 1000 by CVD.

First gate lines YG1, YG2, . . . , YGN are formed in the etched portions of substrate 305 underlying the first troughs 600 between opposing floating gate regions 1000 in the first troughs 600. First gate lines YG1, YG2, . . . , YGN are insulated from substrate 305 by first trough insulation layer 1100. Control gates 335 are formed in the first troughs 600 between opposing floating gate regions 1000, and separated therefrom by the first intergate dielectric 340. In one embodiment, first gate lines YG1, YG2, . . . , YGN and control gates 335 are formed together by depositing N+ polysilicon to fill first troughs 600, and etching back the deposited N+ polysilicon approximately to the top portion of the floating gate regions 1000.

Figure 12:
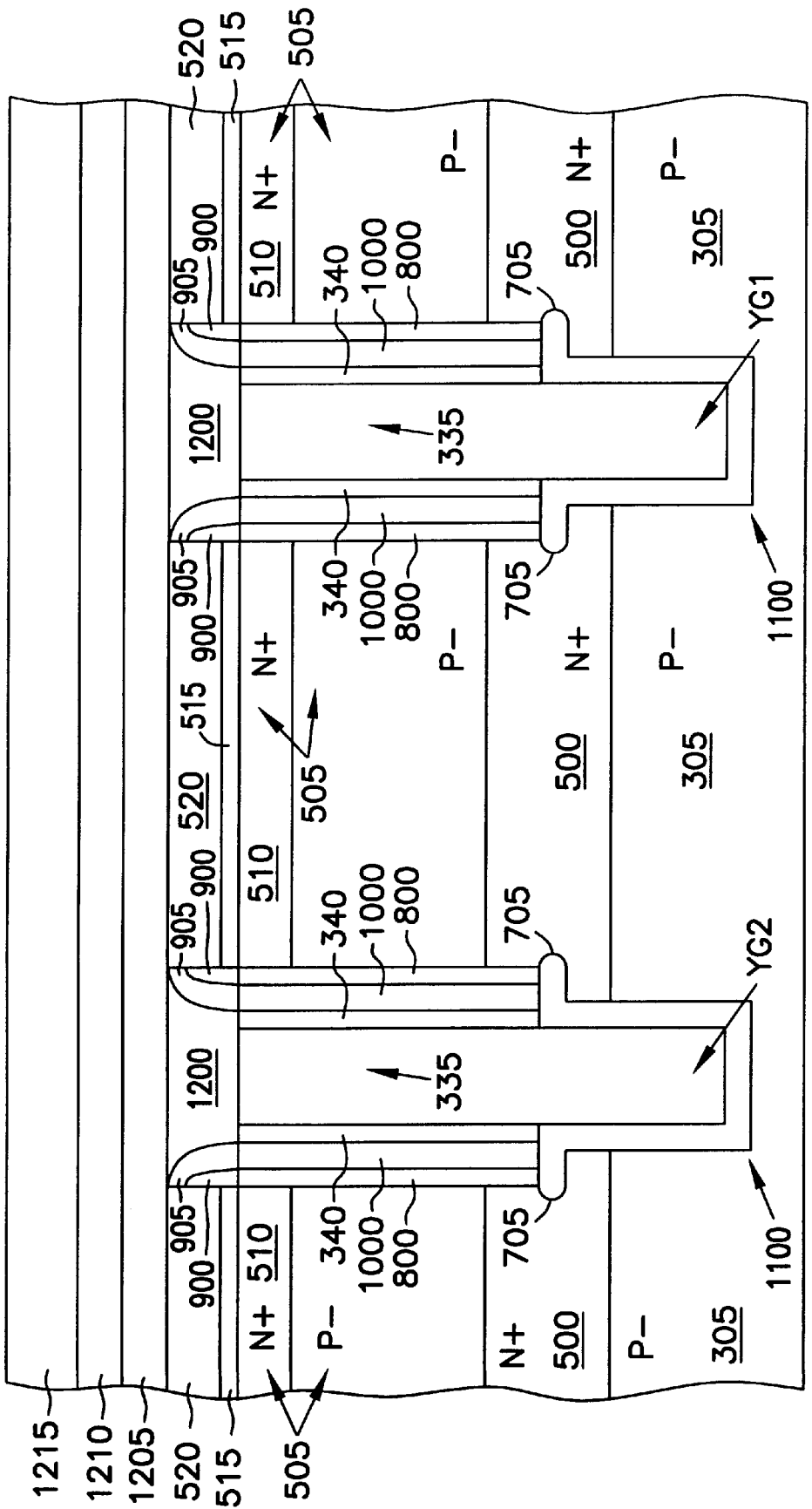

In FIG. 12, a cap layer 1200 is formed, such as by CVD of silicon dioxide, and then planarized, such as by CMP, such that the top surface of cap layer 1200 is substantially even with the top surface of pad nitride 520. A masking layer 1205 is formed, such as silicon nitride deposited by CVD to an approximate thickness of 100 nanometers. Another masking layer 1210 is also formed, such as polysilicon deposited by CVD to an approximate thickness of 100 nanometers. A photoresist layer 1215 is formed on masking layer 1210.

Figure 13:
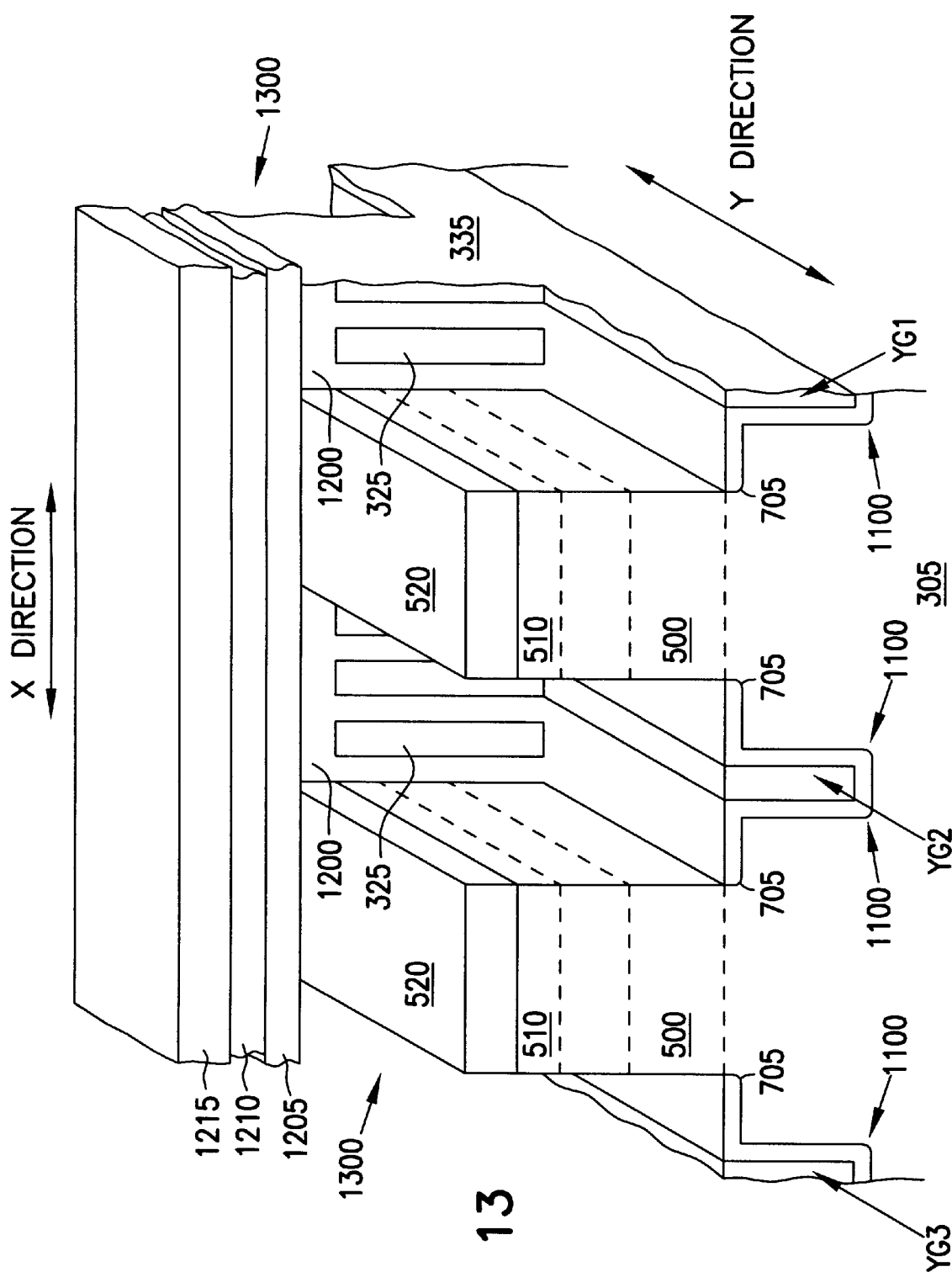

FIG. 13 is a perspective view, illustrating the selective etching, in a second direction (X-direction) that is substantially orthogonal to the first direction (Y-direction), of a plurality of substantially parallel second troughs 1300, as described below. Forming second troughs 1300 includes selectively etching masking layer 1210 and underlying masking layer 1205, such that portions of cap layer 1200 in the second troughs 1300 are exposed. With photoresist layer 1215 still in place, a nonselective dry etch is used to simultaneously remove exposed silicon dioxide and polysilicon in intersecting portions of first troughs 600 and second troughs 1300, including the removing of: portions of cap layer 1200, gate dielectric 800, floating gate regions 1000, intergate dielectric 340, and the control gate 335 portions of first gate lines YG1, YG2, . . . , YGN. The nonselective dry etch removal proceeds at least to the depth of the interface between floating gate regions 1000 and underlying bottom insulation layer 705, thereby separating floating gate regions 1000 into the isolated floating gates 325. During the nonselective dry etch, the regions between first troughs 600 are protected by the pad nitride 520 and the regions between second troughs 1300 are protected by selectively patterned photoresist layer 1215.

Figure 14:
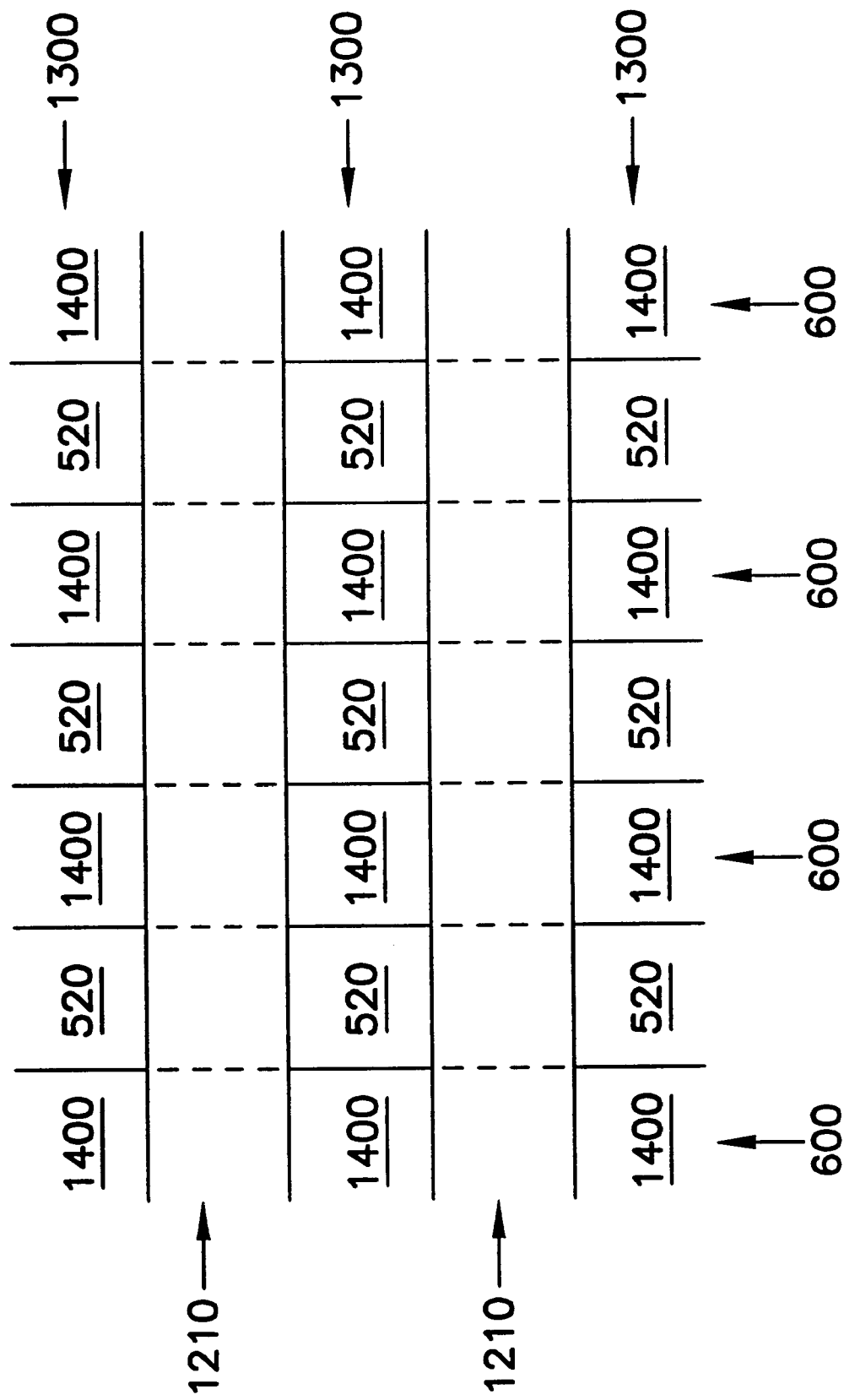

In the plan view of FIG. 14, the photoresist layer 1215 has been removed by conventional photoresist stripping techniques, thereby exposing the underlying selectively patterned polysilicon masking layer 1210. An insulating layer 1400, such as silicon dioxide deposited by CVD, is formed everywhere on the topography of the working surface of substrate 305, thereby filling the nonselectively dry-etched intersections of the first troughs 600 and second troughs 1300. The insulating layer 1400 is then planarized, such as by CMP, and recess etched to a depth that is slightly above the interface between second source-drain layer 510 and pad oxide 515, thereby leaving behind recessed portions of insulating layer 1400 in the nonselectively dry-etched intersections of the first troughs 600 and second troughs 1300, as illustrated in FIG. 14.

Figure 15:
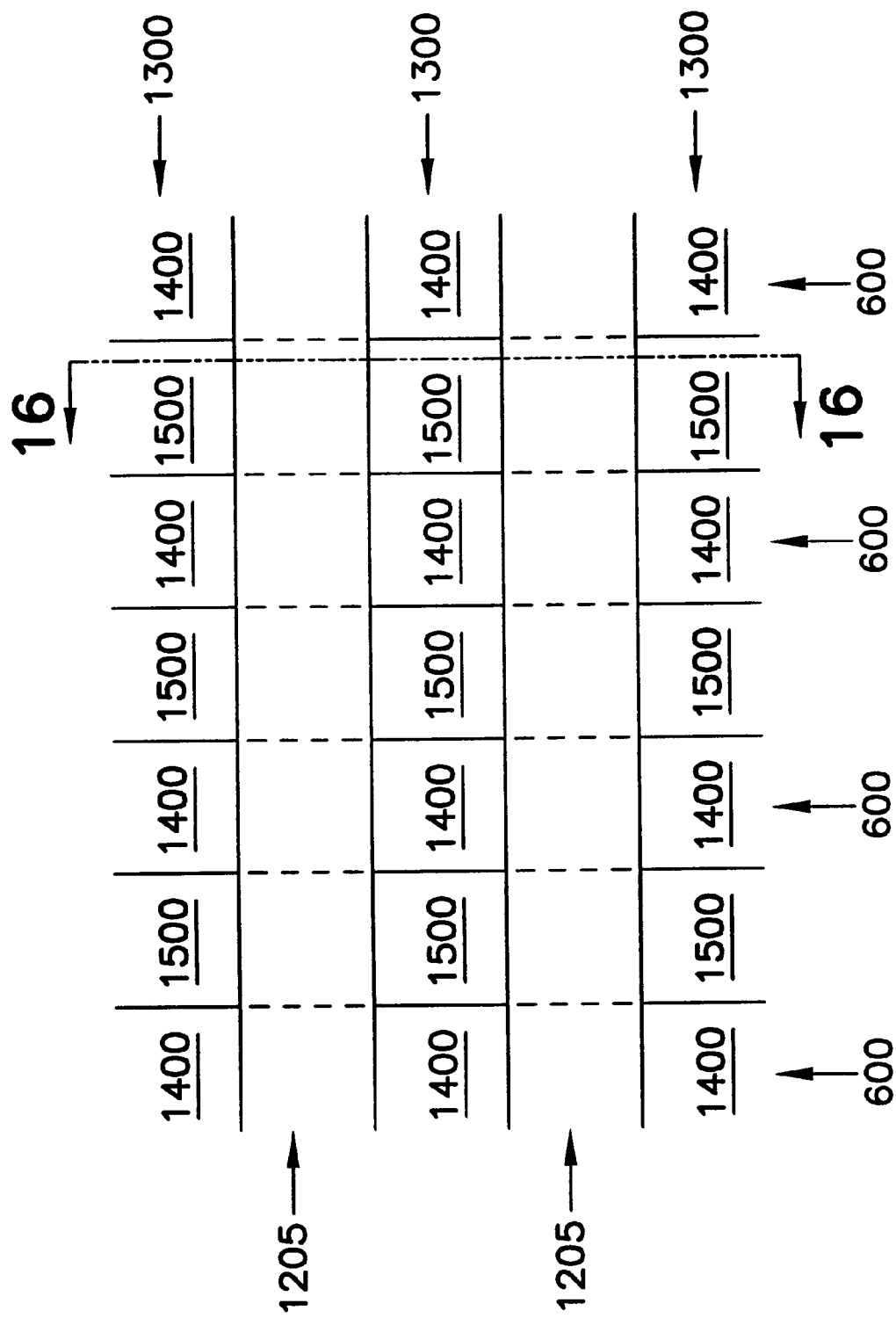

In the plan view of FIG. 15, the exposed portions of pad nitride 520 (e.g., between first troughs 600 and within second troughs 1300) are removed by a selective etch of silicon nitride, thereby exposing underlying portions of pad oxide 515. The exposed portions of pad oxide 515 (e.g., between first troughs 600 and within second troughs 1300) are removed by dipping into a wet etchant, which is timed to remove the exposed portions of pad oxide 515, but to leave most of the remaining portions of the thicker silicon dioxide insulating layer 1400 intact. The removing of portions of pad oxide 515 exposes the second source/drain layer 510 portion of the underlying silicon epitaxial layer 505. The exposed portions of silicon epitaxial layer 505 (e.g., between first troughs 600 and within second troughs 1300) are removed by a selective etching that is preferential to silicon over silicon dioxide, thereby forming recesses 1500 in second troughs 1300 between first troughs 600. Recesses 1500, which are considered to be part of second troughs 1300, are etched through epitaxial layer 505 and at least partially into first source/drain layer 500. Etching recesses 1500 also removes the remaining portions of polysilicon masking layer 1210, thereby exposing underlying silicon nitride masking layer 1205, as illustrated in FIG. 15.

Figure 16:
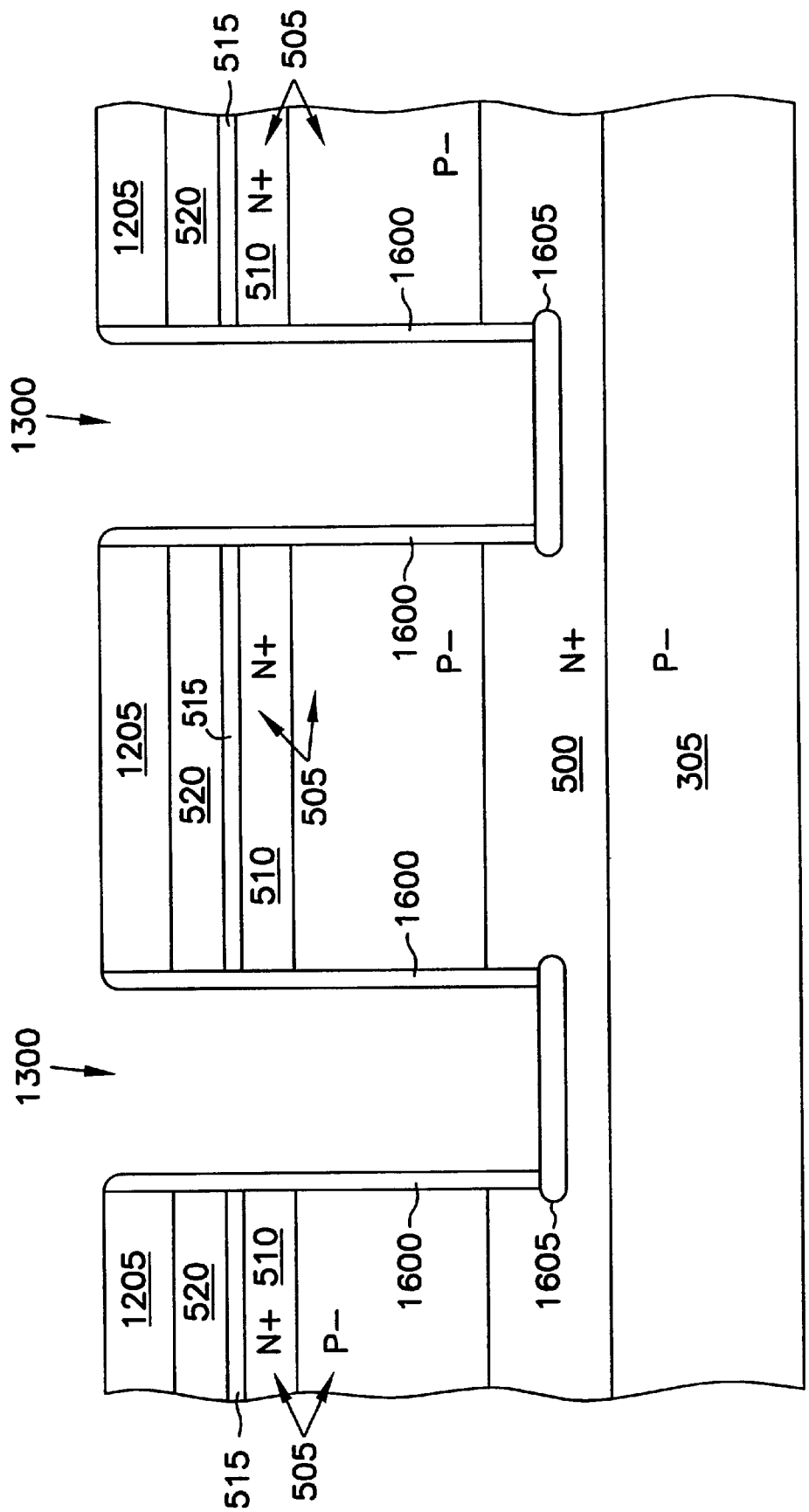

FIG. 16 is a cross-sectional view in the direction of second trough 1300 (e.g. such that the X-direction is orthogonal to the plane of the illustration of FIG. 16), as indicated by the cut line 16—16 in FIG. 15. In FIG. 16, a thin silicon nitride oxidation barrier layer 1600 is deposited by CVD to protect against oxidation of sidewalls of second troughs 1300. Barrier layer 1600 is anisotropically etched to expose bottom portions of second troughs 1300. A bottom insulation layer 1605 of silicon dioxide is formed on the bottoms of second troughs 1300, such as silicon dioxide of approximate thickness of 50 nanometers formed by thermal oxidation of the exposed bottom portions of second troughs 1300.

Figure 17:
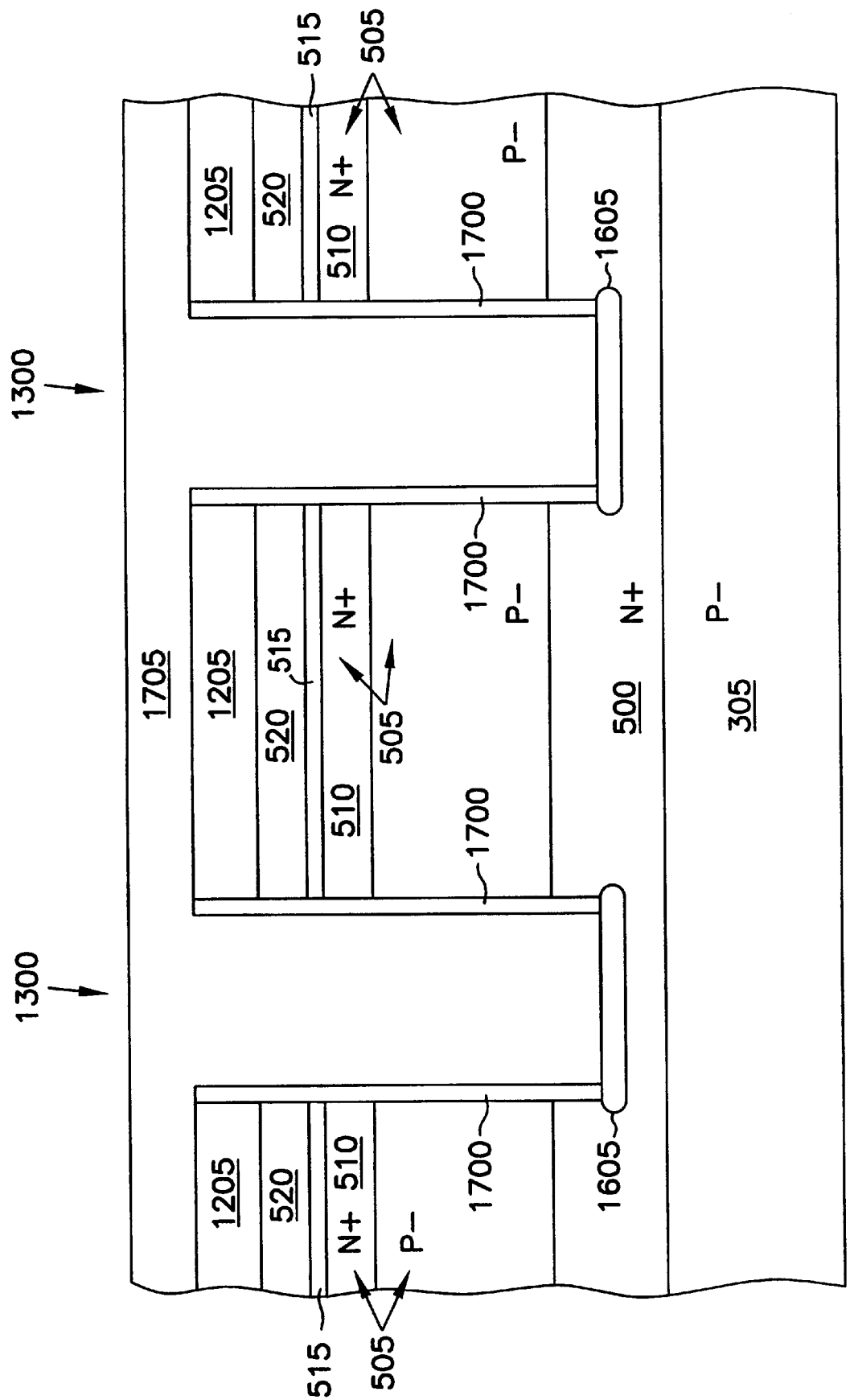

In FIG. 17, barrier layer 1600 is stripped from the sidewalls of the second troughs 1300, such as by a brief phosphoric acid etch, which is timed to expose the sidewalls of the second troughs 1300 but which avoids significant removal of the silicon nitride masking layer 1205. A second gate dielectric layer 1700, such as silicon dioxide of thickness approximately between 5 nanometers and 10 nanometers (sometimes referred to as "tunnel oxide"), is formed substantially adjacent to the exposed sidewalls of the second troughs 1300. A second conductive layer 1705, such as N+ doped polysilicon, is formed in the second troughs 1300, such as by CVD, to fill the second troughs 1300. The second conductive layer 1705 is planarized, such as by chemical mechanical polishing (CMP) or other suitable planarization technique.

Figure 18:
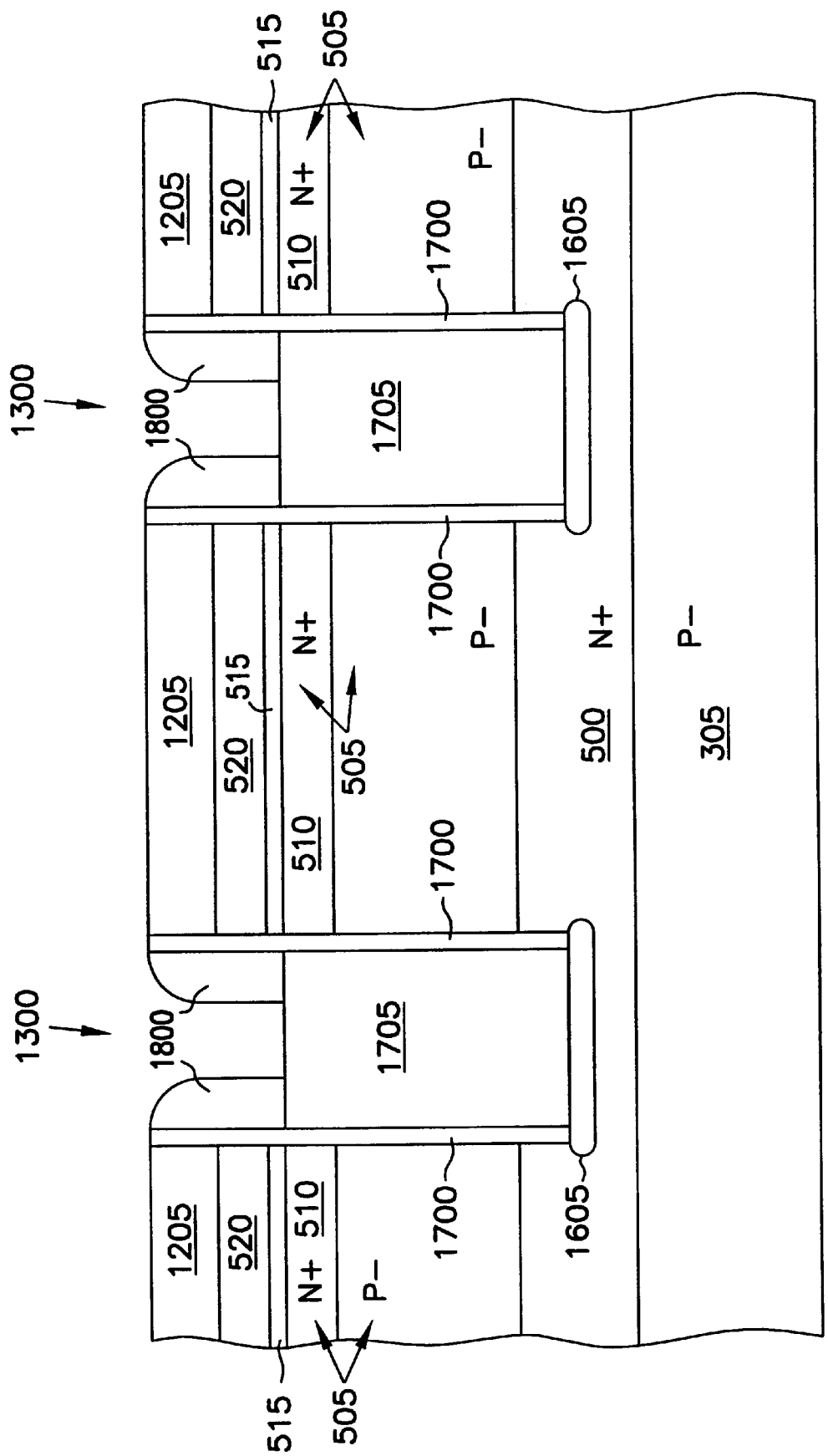

In FIG. 18, the second conductive layer 1705 is etched back in the second troughs 1300 to approximately at or slightly above the level of the silicon surface, which is defined by the interface between the second source/drain layer 510 and the pad oxide 515 layer. Thus, in the second troughs 1300, the top surface of the second conductive layer 1705 is approximately even with the top surface of the recessed portions of insulating layer 1400. A spacer layer, such as silicon nitride of an approximate thickness of 100 nanometers, is deposited by CVD and anisotropically etched by reactive ion etching (RIE) to leave nitride third spacers 1800 along the sidewalls of the second troughs 1300, e.g. on the etched back portions of the second conductive layer 1705 and on the recessed portions of insulating layer 1400, and against the second gate dielectric 1700.

Figure 19:
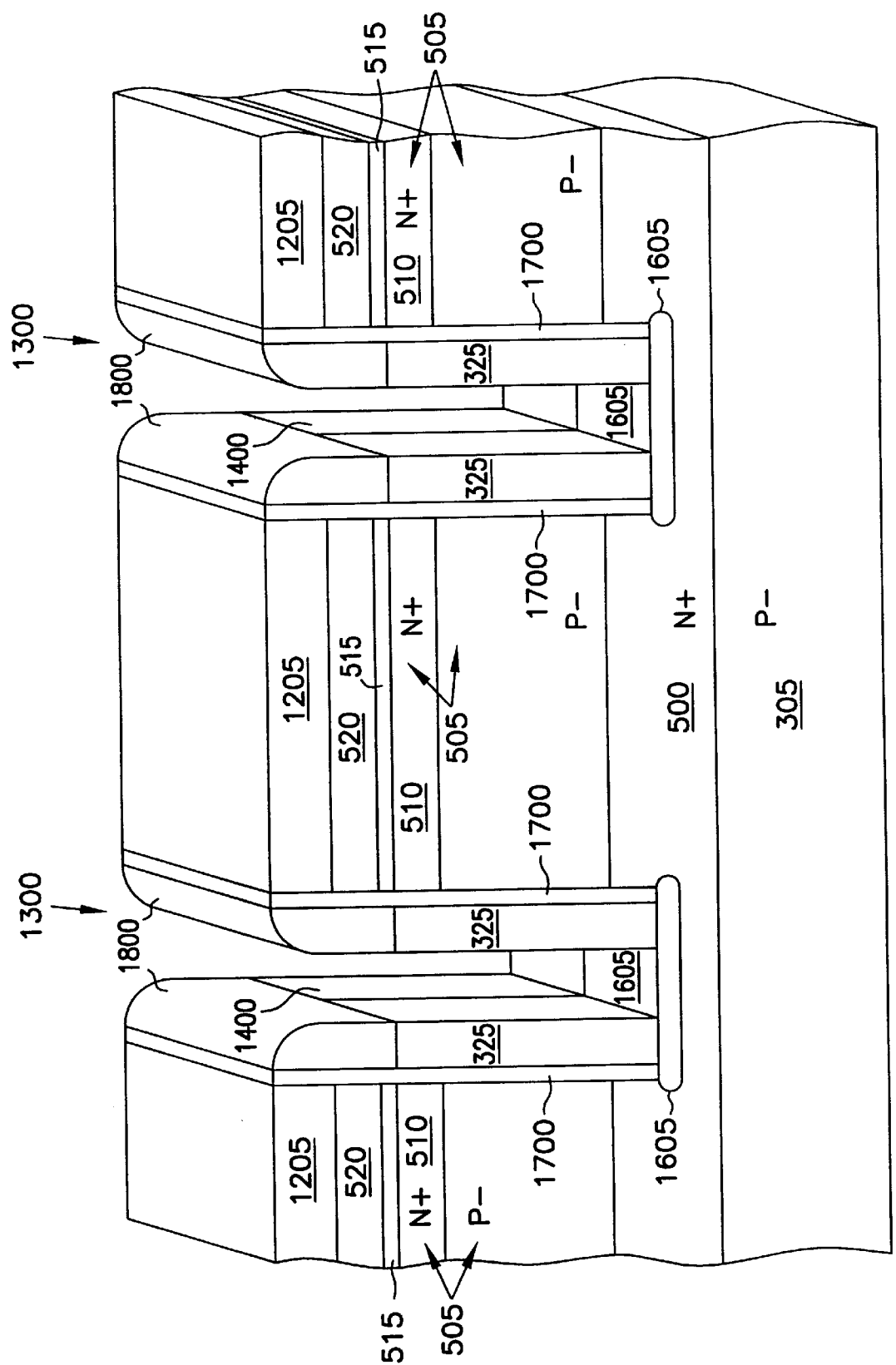

In the perspective view of FIG. 19, third spacers 1800 are used as a mask for the anisotropic etching of the etched back portions of polysilicon second conductive layer 1705 together with the recessed portions of silicon dioxide insulating layer 1400. By first utilizing an etchant to remove silicon dioxide, the second troughs 1300 are etched in insulating layer 1400 to a depth sufficient to carry a second gate line X1, X2, . . . , XN, but not so great as to expose the first gate lines Y1, Y2, . . . , YN underlying the recessed portions of silicon dioxide insulating layer 1400 in second troughs 1300. Then, the anisotropic etch is continued using a selective etchant to remove polysilicon but not silicon dioxide until the bottom insulation layer 1605 is exposed, thereby forming from the second conductive layer 1705 separate floating gates 325 along the sidewalls of the second troughs 1300.

Figure 20:
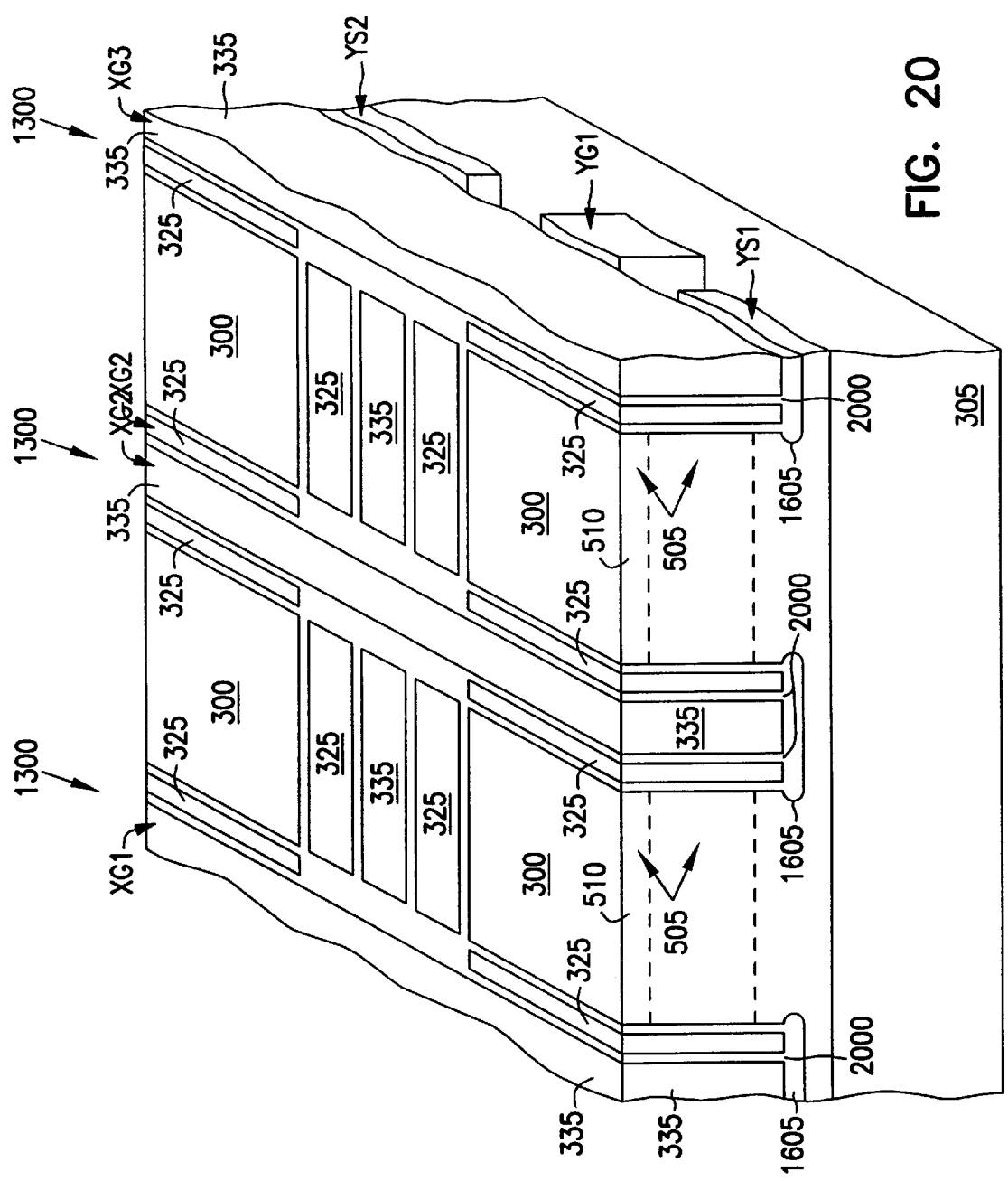

In the perspective view of FIG. 20, a second intergate dielectric 2000 is formed in the second troughs 1300, such that the second intergate dielectric 2000 has an approximate thickness between 7 nanometers and 15 nanometers and being formed by thermal growth of silicon dioxide or deposition of oxynitride by CVD. Control gates 335 are formed between opposing floating gates 325 in the second troughs 1300 and separated therefrom by the second intergate dielectric 2000. The control gates 335 in second troughs 1300 are formed together with the second gate lines X1, X2, ..., XN in second troughs 1300 by a single deposition of N+ doped polysilicon that fills second troughs 1300 and is planarized, such as by CMP. Phosphoric acid is used to remove the remaining silicon nitride, such as third spacers 1800, masking layer 1205, and pad nitride 520, leaving the structure illustrated in FIG. 20. An insulator such as silicon dioxide is then deposited, and subsequent processing follows conventional techniques for forming contact holes, terminal metal, and inter level insulator steps to complete wiring of the cells 205 and other circuits of memory 100.

Figure 21:
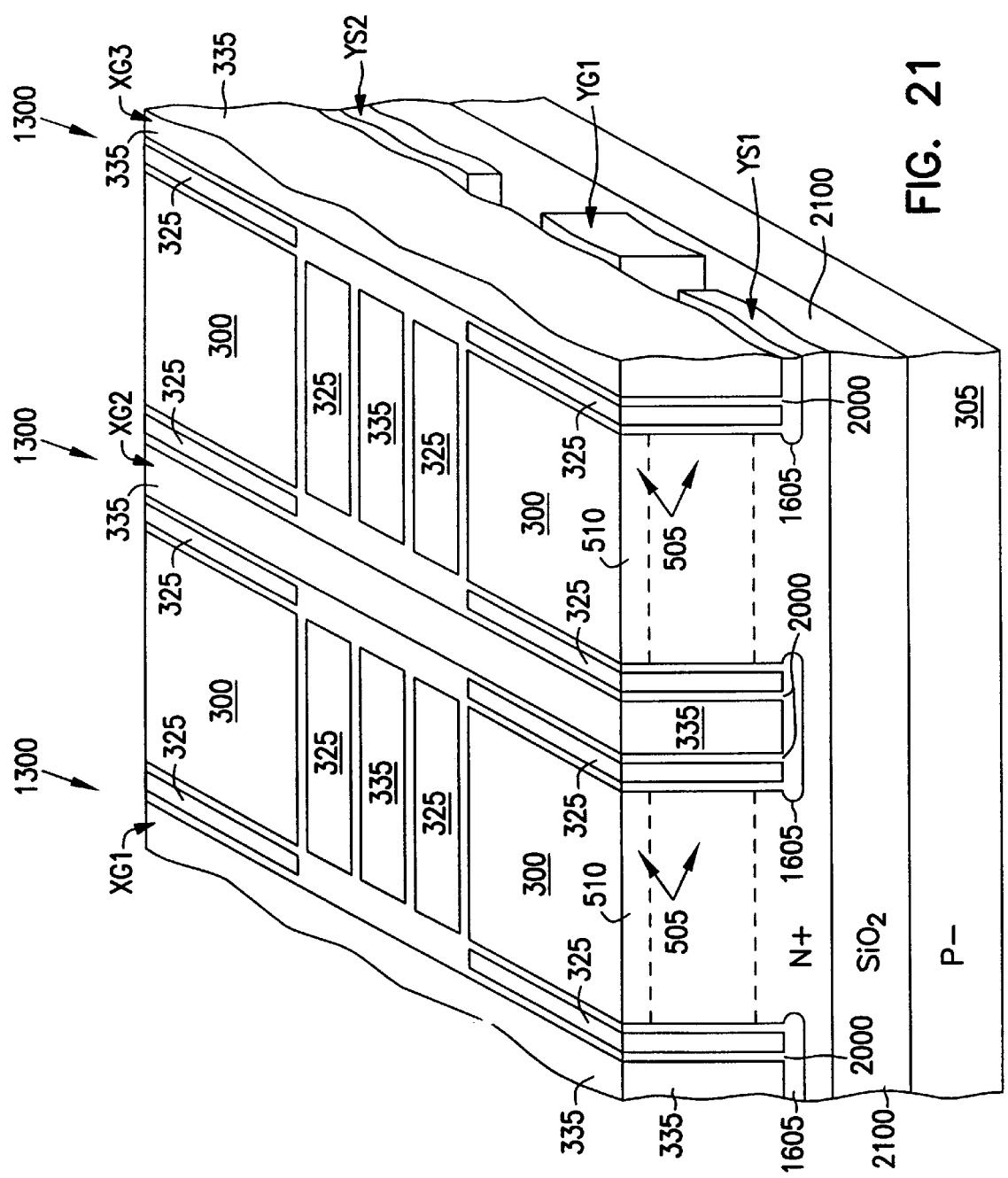
FIG. 21 is a perspective view of a structure resulting from another embodiment of a method of forming the array of memory cells according to the invention, using semiconductor-on-insulator (SOI) techniques.

Though FIGS. 5–20 illustrate generally one embodiment of forming the memory array 105 using bulk silicon processing techniques, in another embodiment a semiconductor-on-insulator (SOI) substrate is formed from substrate 305. In one such embodiment, a P– silicon starting material is used for substrate 305, and processing proceeds similarly to the bulk semiconductor embodiment described in FIG. 5–7. However, after the barrier layer 700 is formed in FIG. 7, an isotropic chemical etch is used to fully undercut the semiconductor regions separating the first troughs 600, and a subsequent oxidation step is used to fill in the evacuated regions formed by the undercutting. As a result, an insulator is formed on the bottoms of first troughs 600, bars of SOI are formed between first troughs 600, and the topography on the working surface of substrate 305 is separated from substrate 305 by an insulating layer 2100 illustrated in the perspective view of FIG. 21.

Thus, in the above described Figures, substrate 305 is understood to include bulk semiconductor as well as SOI embodiments in which the semiconductor integrated circuits formed on the surface of substrate 305 are isolated from each other and an underlying semiconductor portion of substrate 305 by an insulating layer.

One such method of forming bars of SOI is described in the Noble U.S. patent application Ser. No. 08/745,708 which is assigned to the assignee of the present application and which is herein incorporated by reference. Another such method of forming regions of SOI is described in the Forbes U.S. patent application Ser. No. 08/706,230, which is assigned to the assignee of the present application and which is herein incorporated by reference.

In an SOI embodiment of the present invention, processing of first troughs 600 to carry the first gate lines YG1, YG2, ..., YGN varies slightly from the bulk semiconductor embodiment described with respect to FIGS. 10 and 11. A barrier layer 1005 need not be formed to protect the floating gate regions 1000. A portion of the substrate 305 that underlies a portion of the first troughs 600 between the floating gate regions 1000 is removed by selectively anisotropically etching the silicon dioxide insulator portion of substrate 305 to a depth sufficient to carry the first gate lines YG1, YG2, ..., YGN. A portion of the resulting structure of array 105 is illustrated in the perspective view of FIG. 21, which includes an insulating layer 2100 portion of substrate 305, as described above.

Thus, the present invention provides an ultra high density flash EEPROM having increased nonvolatile storage capacity. If a floating gate transistor 200 is used to store a single bit of data, an area of only $F^2$ is needed per bit of data. If multiple charge states (more than two) are used, an area of less than $F^2$ is needed per bit of data. The increased storage capacity of the ultra high density flash EEPROM is particularly advantageous in replacing hard disk drive data storage in computer systems. In such an application, the delicate mechanical components included in the hard disk drive are replaced by rugged, small, and durable solid-state ultra high density flash EEPROM packages. The ultra high density flash EEPROMs provide improved performance, extended rewrite cycles, increased reliability, lower power consumption, and improved portability.

It is to be understood that the above description is intended to be illustrative, and not restrictive. Many other embodiments will be apparent to those of skill in the art upon reviewing the above description. For example, though the memory cells 205 have been described with respect to a particular embodiment having four floating gate transistors 200 per pillar 300, a different number of floating gate transistors per pillar could also be used. It is also understood that the above structures and methods, which have been described with respect to EEPROM memory devices having floating gate transistors 200, are also applicable to dynamic random access memories (DRAMs) or other integrated circuits using vertically oriented field-effect transistors (s) that do not have floating gates. Thus, the scope of the invention is not limited to the particular embodiments shown and described herein.

What is claimed is:

1. A memory cell, comprising:
   a pillar of semiconductor material that extends outwardly from a working surface of a substrate to form source/drain and body regions, the pillar having a number of sides;
   more than two floating gates, each gate associated with a side of the pillar; and
   a number of control gates, each control gate associated with, at least one floating gate so as to allow selective storage and retrieval of data on the floating gates.

2. The memory cell of claim 1, wherein the substrate is a bulk semiconductor.

3. The memory cell of claim 1, wherein the working surface of the substrate includes an insulating layer formed on top of an underlying semiconductor.

4. The memory cell of claim 1, wherein the control gate is capable of storing more than two charge states on its associated floating gate.

5. A memory device, comprising:
   an array of memory cells, each cell including a number of transistor formed around a common pillar of semiconductor material that forms source/drain and body regions for the transistors and a number of floating gates disposed adjacent to the sides of the pillar;
   a plurality of first gate lines that are substantially parallel in a first direction, each first gate line allowing selective storage and retrieval of data on ones of the floating gates;
   a plurality of second gate lines that are substantially parallel in a second direction that is substantially orthogonal to the first direction, each second gate line allowing selective storage and retrieval of data on ones of the floating gates;
   at least one first source/drain interconnection line, interconnecting ones of the first source/drain regions of ones of the memory cells; and
   a plurality of data lines, each data line interconnecting ones of the second source/drain regions of ones of the memory cells.

6. The memory device of claim 5, wherein the pillar extends outwardly from a bulk semiconductor substrate.

7. The memory device of claim 5, wherein the pillar extends outwardly from an insulating layer portion formed on top of an underlying semiconductor substrate.

8. A memory device, comprising:
an array of memory cells, each cell including a number of transistors formed around a common pillar of semiconductor material that forms source/drain and body regions for the transistors and more than two gates disposed adjacent to the sides of the pillar;
a plurality of first gate lines interconnecting ones of the gates in one of the memory cells;
a plurality of second gate lines interconnecting ones of the gates in ones of the memory cells;
at least one first source/drain interconnection line interconnecting ones of the first source/drain regions of ones of the memory cells; and
a plurality of data lines, each data line interconnecting ones of the second source/drain regions of ones of the memory cells.

9. The memory device of claim 8, wherein the pillar extends outwardly from a bulk semiconductor substrate.

10. The memory device of claim 8, wherein the pillar extends outwardly from an insulating layer portion formed on top of an underlying semiconductor substrate.

11. The memory device of claim 8, wherein the first gate lines are substantially parallel in a first direction.

12. The memory device of claim 8, wherein the second gate lines are substantially parallel in a second direction that is substantially orthogonal to the first direction.

13. The memory device of claim 8, wherein the at least one first source/drain interconnection line is formed at least partially within the substrate.

14. A memory cell that is fabricated upon a substrate, the memory cell comprising:
a first conductivity type semiconductor pillar, having top and side surfaces and formed upon the substrate;
a first source/drain region, of a second conductivity type, formed proximal to an interface between the pillar and the substrate;
a second source/drain region, of a second conductivity type, formed in a portion of the pillar that is distal to the substrate and separate from the first source/drain region;
a gate dielectric formed on at least a portion of the side surface of the pillar;
more than two floating gates, each of which is substantially adjacent to a portion of the side surface of the pillar and separated therefrom by the gate dielectric;
a plurality of control gates, each of which is substantially adjacent to one of the floating gates and insulated therefrom; and
an intergate dielectric, interposed between each of the substantially adjacent floating and control gates.

15. The memory cell of claim 14, wherein the substrate includes a bulk semiconductor from which the pillar outwardly extends.

16. The memory cell of claim 14, wherein the substrate includes an insulating layer from which the pillar outwardly extends.

17. A nonvolatile memory array that is fabricated upon a substrate, the memory array comprising:
a plurality of memory cells, each memory cell including:
a first conductivity type semiconductor pillar, having top and side surfaces and formed upon the substrate;
a first source/drain region, of a second conductivity type, formed proximal to an interface between the pillar and the substrate;
a second source/drain region, of a second conductivity type, formed in a portion of the pillar that is distal to the substrate and separate from the first source/drain region;
a gate dielectric, formed on at least a portion of the side surface of the pillar;
more than two floating gates, substantially adjacent to a portion of the side surface of the pillar and separated therefrom by the gate dielectric;
at least one control gate, substantially adjacent to the floating gate and insulated therefrom; and
an intergate dielectric, interposed between the floating gate and the control gate;
a plurality of first gate lines interconnecting ones of the control gates in ones of the memory cells;
a plurality of second gate lines interconnecting ones of the control gates in ones of the memory cells;
at least one first source/drain interconnection line interconnecting ones of the first source/drain regions of ones of the memory cells; and
a plurality of data lines, each data line interconnecting ones of the second source/drain regions of ones of the memory cells.

18. The memory array of claim 17, wherein the substrate includes a bulk semiconductor from which the pillar outwardly extends.

19. The memory array of claim 17, wherein the substrate includes an insulating layer from which the pillar outwardly extends.

20. The memory array of claim 17, wherein the first gate lines are substantially parallel in a first direction.

21. The memory array of claim 17, wherein the second gate lines are substantially parallel in a second direction that is substantially orthogonal to the first direction.

22. The memory array of claim 17, wherein the at least one first source/drain interconnection line is formed at least partially within the substrate.

23. The memory array of claim 17, wherein the first gate lines are formed at least partially within the substrate.

24. The memory array of claim 17, wherein the second gate lines are formed substantially above the substrate.

* * * * *